(12) United States Patent
Lee et al.

(10) Patent No.: US 11,728,409 B2
(45) Date of Patent: Aug. 15, 2023

(54) SEMICONDUCTOR DEVICE

(71) Applicant: SAMSUNG ELECTRONICS CO., LTD., Suwon-si (KR)

(72) Inventors: Sun Hye Lee, Yongin-si (KR); Sung Soo Kim, Hwaseong-si (KR); Ik Soo Kim, Yongin-si (KR); Woong Sik Nam, Seoul (KR); Dong Hyun Roh, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 244 days.

(21) Appl. No.: 17/112,357

(22) Filed: Dec. 4, 2020

(65) Prior Publication Data
US 2021/0328039 A1 Oct. 21, 2021

(30) Foreign Application Priority Data

Apr. 21, 2020 (KR) .................. 10-2020-0047996

(51) Int. Cl.
*H01L 29/66* (2006.01)
*H01L 29/06* (2006.01)
(Continued)

(52) U.S. Cl.
CPC ...... *H01L 29/6656* (2013.01); *H01L 29/0673* (2013.01); *H01L 29/1033* (2013.01);
(Continued)

(58) Field of Classification Search
CPC ......... H01L 21/02603; H01L 21/28141; H01L 21/823431; H01L 21/823821; H01L 21/845; H01L 27/0886; H01L 27/0924; H01L 27/10879; H01L 27/1211; H01L 29/0653; H01L 29/0665; H01L 29/0669; H01L 29/0673; H01L 29/1033; H01L 29/1079; H01L 29/41791; H01L 29/66439; H01L 29/6653; H01L 29/66553; H01L 29/66545; H01L 29/6656; H01L 29/66795; H01L 29/775; H01L 29/785;
(Continued)

(56) References Cited

U.S. PATENT DOCUMENTS 9,881,993 B2 1/2018 Ching et al.
9,960,233 B2 5/2018 Krishnan et al.
(Continued)

FOREIGN PATENT DOCUMENTS

KR 1558061 10/2015

*Primary Examiner* — David C Spalla
(74) *Attorney, Agent, or Firm* — F. Chau & Associates, LLC

(57) ABSTRACT

A semiconductor device includes first and second active patterns each extending in a first direction and are spaced apart from each other in a second direction that is perpendicular to the first direction. A field insulating layer is disposed between the first active pattern and the second active pattern. A first gate structure is disposed on the first active pattern and extends in the second direction. An interlayer insulating layer is disposed between the first gate structure and the field insulating layer. The interlayer insulating layer includes a first part disposed below the first gate structure. A spacer is disposed between the first gate structure and the first part of the interlayer insulating layer.

20 Claims, 20 Drawing Sheets

(51) Int. Cl.
  *H01L 29/10* (2006.01)
  *B82Y 10/00* (2011.01)
(52) U.S. Cl.
  CPC .... *H01L 29/1079* (2013.01); *H01L 29/66545* (2013.01); *H01L 29/66553* (2013.01); *B82Y 10/00* (2013.01)
(58) Field of Classification Search
  CPC ............ H01L 29/7851; H01L 29/7853; H01L 29/7855; H01L 2029/7858; B82Y 10/00
  See application file for complete search history.

(56) References Cited

U.S. PATENT DOCUMENTS

| | | | |
|---|---|---|---|
| 9,972,720 | B2 | 5/2018 | Bae |
| 10,103,238 | B1 | 10/2018 | Zang et al. |
| 10,134,901 | B1 | 11/2018 | Pawlak |
| 10,325,820 | B1 | 6/2019 | Seo et al. |
| 10,332,961 | B2 | 6/2019 | Cheng et al. |
| 10,403,550 | B2 | 9/2019 | Chiang et al. |
| 10,453,736 | B2 | 10/2019 | Chao et al. |
| 2017/0170270 | A1* | 6/2017 | Chu ................. H01L 29/66545 |
| 2019/0067418 | A1 | 2/2019 | Yang et al. |
| 2019/0131415 | A1 | 5/2019 | Cheng et al. |
| 2019/0165145 | A1* | 5/2019 | Ghani ............... H01L 21/02532 |
| 2019/0371941 | A1* | 12/2019 | Basker ................ H01L 21/762 |
| 2020/0266192 | A1* | 8/2020 | Ju ....................... H01L 27/088 |
| 2021/0151560 | A1* | 5/2021 | Ching ............ H01L 21/823481 |

* cited by examiner

SEMICONDUCTOR DEVICE

CROSS-REFERENCE TO RELATED APPLICATION

This application claims priority under 35 U.S.C. § 119 to Korean Patent Application No. 10-2020-0047996, filed on Apr. 21, 2020 in the Korean Intellectual Property Office, the disclosure of which is incorporated herein by reference in its entirety.

TECHNICAL FIELD

The present inventive concepts relate to a semiconductor device and, in particular, to a semiconductor device including Multi-Bridge Channel Field Effect Transistors (MBCFET™).

DISCUSSION OF RELATED ART

The inclusion of a multi-gate transistor has been proposed as a scaling technique for increasing the density of semiconductor devices. In the multi-gate transistor, a fin- or nanowire-shaped silicon body is formed on a substrate and a gate is formed on the surface of the silicon body.

Since the multi-gate transistor uses a three-dimensional (3D) channel, scaling of the multi-gate transistor may be easily achieved. Further, the current control capability may be improved without increasing the gate length of the multi-gate transistor. In addition, a short channel effect (SCE) in which the potential of a channel region is affected by a drain voltage may be effectively suppressed.

SUMMARY

Aspects of the present inventive concepts provide a semiconductor device having an enhanced reliability by preventing a field insulating layer from being excessively etched out during the process of forming gate cuts in such a way of arranging a spacer below each of gate structures and gate cuts.

According to an exemplary embodiment of the present inventive concepts, a semiconductor device includes first and second active patterns each extending in a first direction and are spaced apart from each other in a second direction that is perpendicular to the first direction. A field insulating layer is disposed between the first active pattern and the second active pattern. A first gate structure is disposed on the first active pattern and extends in the second direction. An interlayer insulating layer is disposed between the first gate structure and the field insulating layer. The interlayer insulating layer includes a first part disposed below the first gate structure. A spacer is disposed between the first gate structure and the first part of the interlayer insulating layer.

According to an exemplary embodiment of the present inventive concepts, a semiconductor device includes first and second active patterns each extending in a first direction and are spaced apart from each other in a second direction that is perpendicular to the first direction. A field insulating layer is disposed between the first active pattern and the second active pattern. A first gate structure is disposed on the first active pattern and extends in the second direction. A second gate structure is disposed on the second active pattern and extends in the second direction. The second gate structure is spaced apart from the first gate structure in the second direction. A gate cut is disposed on the field insulating layer and is positioned between the first gate structure and the second gate structure. An interlayer insulating layer is disposed between the gate cut and the field insulating layer. The interlayer insulating layer includes a first part disposed below the gate cut, a second part disposed on a first lateral side of the first part, and a third part disposed on a second lateral side of the first part that is opposite to the first lateral side of the first part. A spacer is disposed between the gate cut and the first part of the interlayer insulating layer.

According to an exemplary embodiment of the present inventive concepts, a semiconductor device includes first and second active patterns each extending in a first direction and are spaced apart from each other in a second direction that is perpendicular to the first direction. A field insulating layer is disposed between the first active pattern and the second active pattern. A plurality of nanosheets is disposed on the first active pattern and sequentially stacked in a third direction that is perpendicular to the first and second directions. A first gate structure is disposed on the first active pattern and extends in the second direction. The first gate structure surrounds each of the plurality of nanosheets. A second gate structure is disposed on the first active pattern and extends in the second direction. The second gate structure is spaced apart from the first gate structure in the first direction. A third gate structure is disposed on the second active pattern and extends in the second direction. The third gate structure is spaced apart from the second gate structure in the second direction. A gate cut is disposed on the field insulating layer and is positioned between the second gate structure and the third gate structure. An interlayer insulating layer is disposed between the first gate structure and the field insulating layer and between the gate cut and the field insulating layer. The interlayer insulating layer includes a first part disposed below the first gate structure, a second part disposed on a first lateral side of the first part, a third part disposed on a second lateral side of the first part that is opposite to the first lateral side of the first part, and a fourth part disposed below the gate cut. A spacer is disposed between the first gate structure and the interlayer insulating layer, between the gate cut and the interlayer insulating layer, and between the field insulating layer and the interlayer insulating layer. A source/drain region is disposed on at least one side of the first gate structure. The first part of the interlayer insulating layer is disposed between the second part of the interlayer insulating layer and the third part of the interlayer insulating layer and is configured to connect the second part of the interlayer insulating layer to the third part of the interlayer insulating layer.

However, aspects of the present inventive concepts are not restricted to the one set forth herein. The above and other aspects of the present inventive concepts will become more apparent to one of ordinary skill in the art to which the present inventive concepts pertain by referencing the detailed description of exemplary embodiments given below.

BRIEF DESCRIPTION OF THE DRAWINGS

The above and other aspects and features of the present inventive concepts will become more apparent by describing in detail exemplary embodiments thereof with reference to the attached drawings, in which.

DETAILED DESCRIPTION OF EXEMPLARY EMBODIMENTS

Hereinafter, a semiconductor device according to exemplary embodiments of the present inventive concepts will be described with reference to FIGS. 1 to 4.

Figure 1:
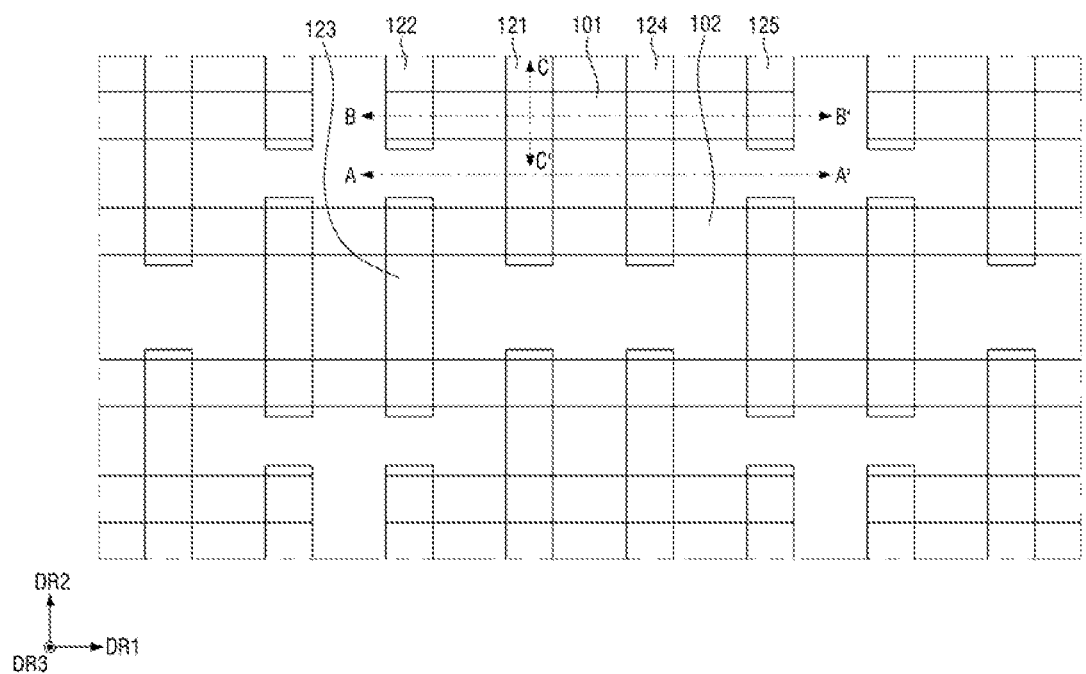
FIG. 1 is a plan view illustrating a semiconductor device according to an exemplary embodiment of the present inventive concepts.
Figure 2:
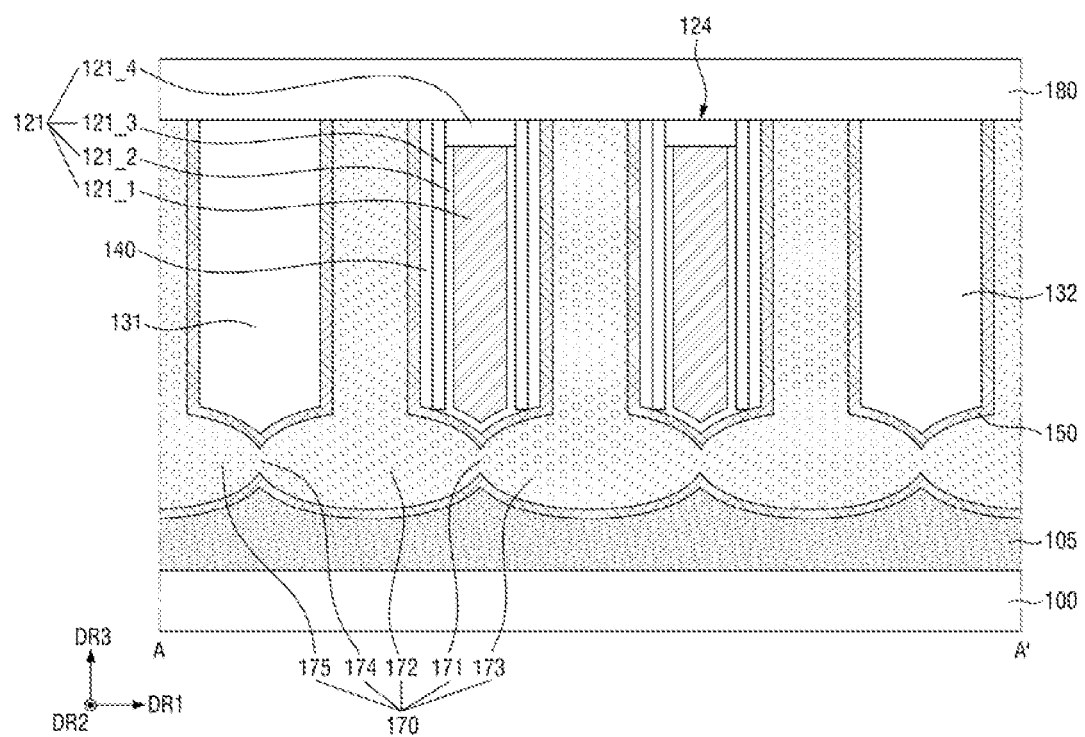
FIG. 2 is a cross-sectional view of a semiconductor device taken along line A-A' of FIG. 1 according to an exemplary embodiment of the present inventive concepts.
Figure 3:
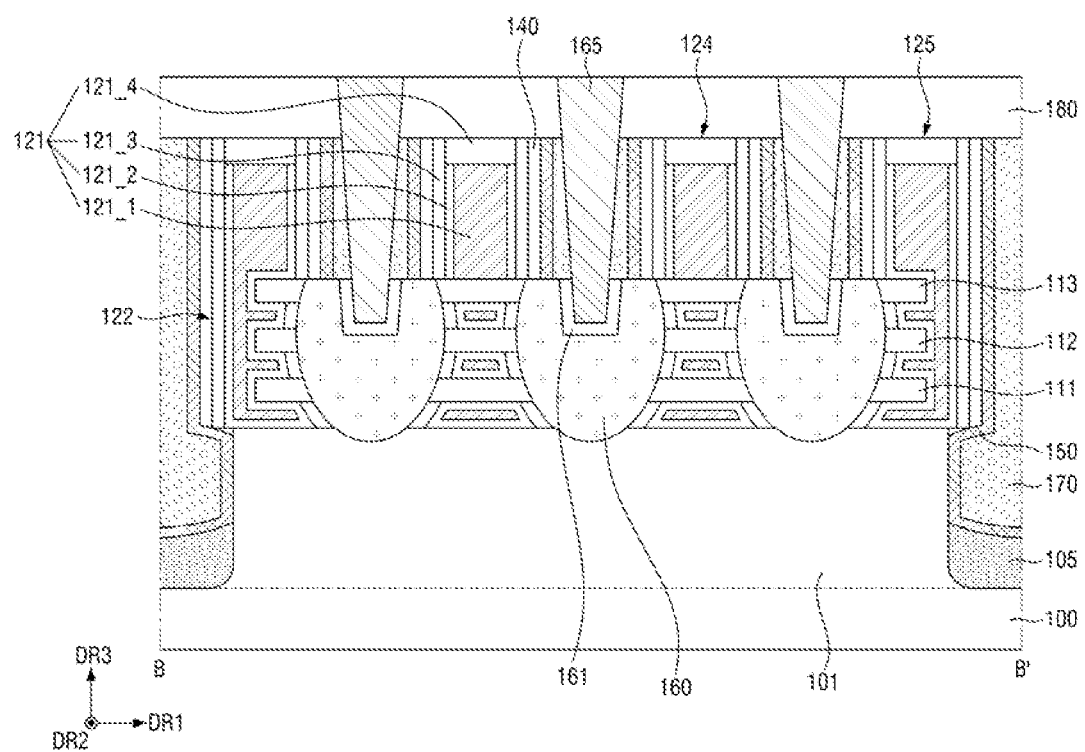
FIG. 3 is a cross-sectional view of a semiconductor device taken along line B-B' of FIG. 1 according to an exemplary embodiment of the present inventive concepts.
Figure 4:
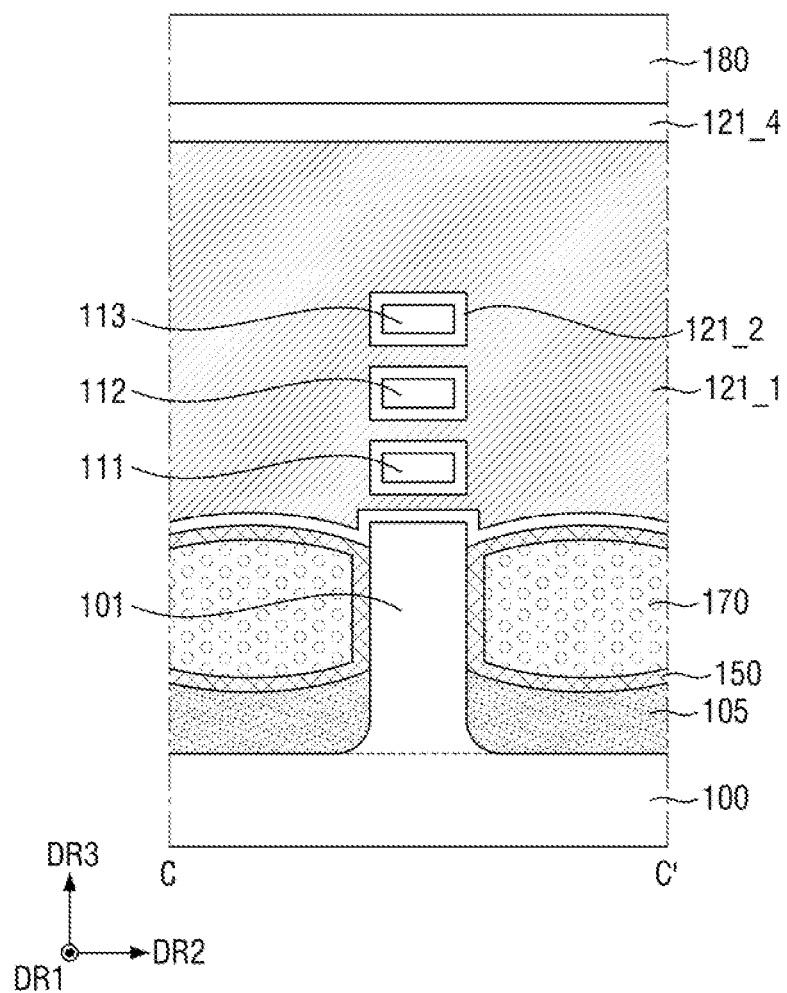
FIG. 4 is a cross-sectional view of a semiconductor device taken along line C-C' of FIG. 1 according to an exemplary embodiment of the present inventive concepts.

FIG. 1 is a schematic plan view illustrating a semiconductor device according to an exemplary embodiment of the present inventive concepts. FIG. 2 is a cross-sectional view of a semiconductor device taken along line A-A' of FIG. 1. FIG. 3 is a cross-sectional view taken along line B-B' of FIG. 1. FIG. 4 is a cross-sectional view taken along C-C' of FIG. 1.

With reference to FIGS. 1 to 4, the semiconductor device according to an exemplary embodiment of the present inventive concepts includes a substrate 100, a first active pattern 101, a second active pattern 102, a field insulating layer 105, first to third nanosheets 111, 112, and 113, first to fifth gate structures 121, 122, 123, 124, and 125, first and second gate cuts 131 and 132, an oxide layer 140, a spacer 150, a source/drain region 160, a silicide layer 161, a source/drain contact 165, a first interlayer insulating layer 170, and a second interlayer insulating layer 180.

In an exemplary embodiment, the substrate 100 may be a bulk silicon or silicon-on-insulator (SOI) substrate. In another exemplary embodiment, the substrate 100 may be a silicon substrate or may include other materials such as silicon germanium, silicon germanium on insulator (SGOI), indium antimonide, a lead tellurium compound, indium arsenide, indium phosphide, gallium arsenide, or gallium antimonide. However, exemplary embodiments of the present inventive concepts are not limited thereto.

The plurality of active patterns may be disposed on the substrate 100. For example, the first active pattern 101 and the second active pattern 102 may be disposed on the substrate 100. In an exemplary embodiment, each of the first active pattern 101 and the second active pattern 102 may be formed by etching a portion of the substrate 100, and may include an epitaxial layer grown from the substrate 100.

In an exemplary embodiment, the first active pattern 101 and the second active pattern 102 may each have a shape of a pin-type pattern. The first active pattern 101 and the second active pattern 102 may each be separated by the field insulating layer 105.

As shown in the exemplary embodiment of FIG. 1, the first active pattern 101 may extend (e.g., longitudinally) in the first direction DR1. The second active patter 102 may extend (e.g., longitudinally) in the first direction DR1. The second active pattern 102 may be spaced apart from the first active pattern 101 in a second direction DR2 that is perpendicular to the first direction DR1. The first active pattern 101 and the second active pattern 102 may extend in parallel in the first direction DR1.

The field insulating layer 105 may be disposed on the substrate 100. As shown in the exemplary embodiment of FIG. 3, the field insulating layer 105 may be disposed on the sidewalls of each of the first active pattern 101 and the second active pattern 102. For example, the field insulating layer 105 may be disposed between the first active pattern 101 and the second active pattern 102. The first active pattern 101 and the second active pattern 102 may each be defined by the field insulating layer 105.

In an exemplary embodiment, the field insulating layer 105 may include at least one layer selected from a silicon oxide layer, a silicon nitride layer and a silicon oxynitride layer. However, exemplary embodiments of the present inventive concepts are not limited thereto.

Although it is exemplarily illustrated in FIG. 3 that the three nanosheets 111, 112, and 113 are arranged consecutively on the substrate 100, exemplary embodiments of the present inventive concepts are not limited thereto. For example, in some other exemplary embodiments, a plurality of nanosheets are arranged consecutively on the substrate 100 and the number of the plurality of nanosheets arranged on the substrate 100 may vary.

The first to third nanosheets 111, 112, and 113 may be sequentially arranged on the substrate 100 to be spaced apart from each other in a third direction DR3 that is perpendicular to the first and second directions DR1 and DR2.

For example, the first nanosheet 111 may be arranged to be spaced apart from the first active pattern 101 in the third direction DR3 on the substrate 100. The second nanosheet 112 may be arranged to be spaced apart from the first nanosheet 111 in the third direction DR3 on the substrate 100. The third nanosheet 113 may be arranged to be spaced apart from the second nanosheet 112 in the third direction DR3 on the substrate 100. The first to third nanosheet 111, 112, and 113 may each extend (e.g., longitudinally) in the first direction DR1.

As shown in the exemplary embodiment of FIG. 1, the second gate structure 122, the first gate structure 121, the fourth gate structure 124, and the fifth gate structure 125 may be disposed on the first active pattern 101 and may be sequentially arranged to be spaced apart from each other in the first direction DR1. The third gate structure 123 may be disposed on the second active pattern 102 and may be arranged to be spaced apart from the second gate structure 122 in the second direction DR2.

The first gate structure 121 may extend (e.g., longitudinally) in the second direction DR2 on the first and second active patterns 101 and 102. The second gate structure 122 may extend (e.g., longitudinally) in the second direction DR2 and be disposed on the first active pattern 101. The third gate structure 123 may extend (e.g., longitudinally) in the second direction DR2 and be disposed on the second active pattern 102. The fourth gate structure 124 may extend (e.g., longitudinally) in the second direction DR2 and be disposed on the first and second active patterns 101 and 102. The fifth gate structure 125 may extend (e.g., longitudinally) in the second direction DR2 and be disposed on the first active pattern 101.

As shown in the exemplary embodiment of FIG. 4, the first gate structure 121 may surround each of the first to third nanosheets 111, 112, and 113. The fourth gate structure 124 may also surround each of the first to third nanosheets 111, 112, and 113.

The second gate structure 122 may wholly surround a first lateral end of each of the first to third nanosheets 111, 112, and 113. The fifth gate structure 125 may wholly surround a second lateral end of each of the first to third nanosheets 111, 112, and 113. The second lateral end of each of the first to third nanosheets 111, 112, and 113 is opposite to the first lateral end of each of the first to third nanosheets 111, 112, and 113.

The first to fifth gate structures 121, 122, 123, 124, and 125 may each include a gate electrode 121_1, a gate insulating layer 121_2, a gate spacer 121_3, and a capping pattern 121_4.

As shown in the exemplary embodiment of FIG. 4, the gate electrode 121_1 may extend in the second direction DR2 on the substrate 100. The gate electrode 121_1 may surround each of the first to third nanosheets 111, 112, and 113.

In an exemplary embodiment, the gate electrode 121_1 may include at least one compound selected from titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn) and vanadium (V). However, exemplary embodiments of the present inventive concepts are not limited thereto. The gate electrode 121_1 may include conductive metal oxide, conductive metal oxynitride or the like, and may include an oxidized form of the aforementioned material.

The gate insulating layer 121_2 may be disposed along both the sidewalls and bottom surface of the gate electrode 121_1. As shown in the exemplary embodiment of FIGS. 3-4, the gate insulating layer 121_2 may be disposed between the first active pattern 101 and the gate electrode 121_1 (e.g., in the third direction DR3), between the spacer 150 and the gate electrode 121_1 (e.g., in the third direction DR3), between the first nanosheet 111 and the gate electrode 121_1, between the second nanosheet 112 and the gate electrode 121_1, between the third nanosheet 113 and the gate electrode 121_1, and between the gate spacer 121_3 and the gate electrode 121_1 in the third direction DR3).

In an exemplary embodiment, the gate insulating layer 121_2 may include at least one compound selected from silicon oxide, silicon oxynitride, silicon nitride, and a high dielectric constant material having a higher dielectric constant than silicon oxide. The high dielectric constant material may include, for example, at least one compound selected from hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide and lead zinc niobate.

The capping pattern 121_4 may be disposed on the gate electrode 121_1 and the gate insulating layer 121_2 (e.g., in the third direction DR3). Although it is illustrated in the exemplary embodiment of FIG. 3 for convenience of explanation that the gate insulating layer 121_2 is not disposed between the capping pattern 121_4 and the gate electrode 121_1, exemplary embodiments of the present inventive concepts are not limited thereto.

Although it is illustrated in the exemplary embodiment of FIG. 3 that the capping pattern 121_4 is disposed between the inner sidewalls of the gate spacer 121_3 (e.g., in the first direction DR1), exemplary embodiments of the present inventive concepts are not limited thereto. For example, in some other exemplary embodiments, the upper surface of the gate spacer 121_3 may be recessed down below the upper surface of the first interlayer insulating layer 170 in the same manner as the first gate electrode 121_1. In this exemplary embodiment, the capping pattern 121_4 may be disposed on the upper surface of the gate spacer 121_3 and the upper surface of the gate electrode 121_1. For example, a lower surface of the capping pattern 121_4 may directly contact upper surfaces of the gate spacer 121_3 and the gate electrode 121_1.

In an exemplary embodiment, the capping pattern 121_4 may include a material having an etch selectivity with respect to the first interlayer insulating layer 170. For example, the capping pattern 121_4 may include at least one compound selected from silicon nitride (SiN), silicon oxynitride (SiON), silicon oxide (SiO$_2$), silica carbonitride (SiCN), and silicon oxycarbonitride (SiOCN).

The gate spacer 121_3 may extend in the second direction DR2 along both sidewalls of the gate electrode 121_1 and may directly contact the sidewalls of the gate insulating layer 121_2 and the capping pattern 121_4. As shown in the exemplary embodiment of FIG. 3, the gate spacer 121_3 may be disposed between the first active pattern 101 and the first nanosheet 111 (e.g., in the third direction DR3), between the first nanosheet 111 and the second nanosheet 112 (e.g., in the third direction DR3), and between the second nanosheet 112 and the third nanosheet 113 (e.g., in the third direction DR3).

Although it is illustrated in the exemplary embodiments of FIGS. 3 and 4 that the gate spacer 121_3 is formed as a single layer, exemplary embodiments of the present inventive concepts are not limited thereto. For example, in some other exemplary embodiments, the gate spacer 121_3 may be formed as multiple layers.

In an exemplary embodiment, the gate spacer 121_3 may include at least one of compound selected from silicon nitride (SiN), silicon oxynitride (SiON), silicon oxide (SiO$_2$), silicon oxynitride (SiOCN), silicon boron nitride (SiBN), silicon oxyboron nitride (SiOBN), and silicon oxycarbide (SiOC). However, exemplary embodiments of the present inventive concepts are not limited thereto.

The first gate cut 131 may be disposed on the field insulating layer 105 and may be positioned between the second gate structure 122 and the third gate structure 123 (e.g., in the second direction DR2). The second gate cut 132 may be disposed on the field insulating layer 105 and may be positioned close to the fifth gate structure 125 in the second direction DR2.

The spacer 150 may directly contact the sidewalls of each of the first and second gate cuts 131 and 132. However, exemplary embodiments of the present inventive concepts are not limited thereto. For example, as shown in the exemplary embodiment of FIG. 2, the oxide layer 140 may be disposed between each of the sidewalls of the first and second gate cuts 131 and 132 and the spacer 150. In some other exemplary embodiments, the oxide layer 140 and the gate spacer 121_3 may be disposed between each of the sidewalls of the first and second gate cuts 131 and 132 and the spacer 150.

In an exemplary embodiment, each of the first gate cut 131 and the second gate cut 132 may include at least one compound selected from silicon nitride (SiN), silicon oxynitride (SiON), silicon oxide (SiO$_2$) and silicon oxynitride (SiOCN). However, exemplary embodiments of the present inventive concepts are not limited thereto.

The oxide layer 140 may extend in the second direction DR2 along the sidewalls of the gate spacer 121_3. In an exemplary embodiment, the oxide layer 140 may include silicon oxide (SiO2). However, exemplary embodiments of the present inventive concepts are not limited thereto.

The source/drain region 160 may be disposed on at least one lateral side of the first gate structure 121. For example, as shown in the exemplary embodiment of FIG. 3, the source/drain region 160 may be disposed between the second gate structure 122 and the first gate structure 121 (e.g., in the first direction DR1), between the first gate structure 121 and the fourth gate structure 124 (e.g., in the first direction DR1), and between the fourth gate structure 124 and the fifth gate structure 125 (e.g., in the first direction DR1). As shown in the exemplary embodiment of FIG. 3, the source/drain region 160 may be disposed directly on the first active pattern 101. The source/drain region 160 may contact each of the first to third nanosheets 111, 112, and 113.

Although it is illustrated in FIG. 3 that an upper surface of the source/drain region 160 is arranged on the same plane (e.g., in the third direction DR3) as the upper surface of the third nanosheet 113, exemplary embodiments of the present inventive concepts are not limited thereto.

The first interlayer insulating layer 170 may be disposed on the field insulating layer 105 and the first active pattern 101.

The first interlayer insulating layer 170 may surround the sidewalls of each of the first to third gate structures 121, 122, 123, 124, and 125 and the sidewalls of each of the first and second gate cuts 131 and 132.

At least part of the first interlayer insulating layer 170 may be disposed below each of the first gate structure 121, the fourth gate structure 124, the first gate cut 131, and the second gate cut 132. For example, at least a partial portion of the first interlayer insulating layer 170 may be disposed between the first gate structure 121 and the field insulating layer 105 (e.g., in the third direction DR3), between the fourth gate structure 124 and the field insulating layer 105 (e.g., in the third direction DR3), between the first gate cut 131 and the field insulating layer 105 (e.g., in the third direction DR3), and between the second gate cut 132 and the field insulating layer 105 (e.g., in the third direction DR3).

For example, as shown in the exemplary embodiment of FIG. 2, the first interlayer insulating layer 170 may include first to fifth parts 171, 172, 173, 174, and 175.

The first part 171 of the first interlayer insulating layer 170 may be disposed between a lower surface of the first gate structure 121 and the field insulating layer 105 (e.g., in the third direction DR3). The second part 172 of the first interlayer insulating layer 170 may be disposed on a first lateral side of the first part 171 of the first interlayer insulating layer 170 and may extend between the first gate structure 121 and the first gate cut (e.g., in the first direction DR1). The third part 173 of the first interlayer insulating layer 170 may be disposed on a second lateral side of the first part 171 of the first interlayer insulating layer 170, the second side facing (e.g., is opposite to) the first lateral side of the first part 171 of the first interlayer insulating layer 170. The third part 173 of the first interlayer insulating layer 170 may extend between the first gate structure 121 and the fourth gate structure 124 (e.g., in the first direction DR1).

The first part 171 of the first interlayer insulating layer 170 may connect the second part 172 of the first interlayer insulating layer 170 to the third part 173 of the first interlayer insulating layer 170. For example, the first part 171 of the first interlayer insulating layer 170 may connect a center portion (e.g., in the first direction DR1) of the second part 172 of the first interlayer insulating layer 170 to a center portion (e.g., in the first direction DR1) of the third part 173 of the interlayer insulating layer 170.

The fourth part 174 of the interlayer insulating layer 170 may be disposed between a lower surface of the first gate cut 131 and the field insulating layer 105 (e.g., in the third direction DR3). In this exemplary embodiment, the second part 172 of the first interlayer insulating layer 170 may be disposed on the first lateral side of the fourth part 174 of the first interlayer insulating layer 170. The fifth part 175 of the first interlayer insulating layer 170 may be disposed on the second lateral side of the fourth part 174 of the first interlayer insulating layer 170, the second side facing (e.g., is opposite to) the first side of the fourth part 174 of the first interlayer insulating layer 170 (e.g., in the first direction DR1).

The fourth part 174 of the first interlayer insulating layer 170 may connect the second part 172 of the first interlayer insulating layer 170 to the fifth part 175 of the first interlayer insulating layer 170. For example, the fourth part 174 of the first interlayer insulating layer 170 may connect a center portion (e.g., in the first direction DR1) of the second part 172 of the first interlayer insulating layer 170 to a center portion (e.g., in the first direction DR1) of the fifth part 175 of the first interlayer insulating layer.

As shown in the exemplary embodiment of FIG. 2, the second part 172 of the first interlayer insulating layer 170, the third part 173 of the first interlayer insulating layer 170, and the fifth part 175 of the first interlayer insulating layer 170 may each have an elliptical shape in a plan view (e.g., in a plane defined in the first and third directions DR1, DR3).

However, exemplary embodiments of the present inventive concepts are not limited thereto.

In an exemplary embodiment, the first interlayer insulating layer 170 may include at least one compound selected from silicon oxide ($SiO_2$), silicon nitride (SiN), and silicon oxynitride (SiON). However, exemplary embodiments of the present inventive concepts are not limited thereto.

The spacer 150 may be disposed along the sidewalls and bottom surface of the first interlayer insulating layer 170. For example, the spacer 150 may wholly surround the sidewalls and bottom surface of the first interlayer insulating layer 170. However, exemplary embodiments of the present inventive concepts are not limited thereto.

The spacer 150 may be disposed between each of the first to fifth gate structures 121, 122, 123, 124, and 125 and the first interlayer insulating layer 170, between each of the first and second gate cuts 131 and 132 and the first interlayer insulating layer 170, and between the field insulating layer 105 and the first interlayer insulating layer 170 (e.g., in a third direction DR3).

The spacer 150 may be disposed below the first gate structure 121. For example, as shown in the exemplary embodiment of FIG. 2, the spacer 150 may be disposed between the first gate structure 121 and the first part 171 of the first interlayer insulating layer 170 (e.g., in the third direction DR3). The spacer 150 may also be disposed between an upper surface of the field insulating layer 105 and the first part 171 of the first interlayer insulating layer 170 (e.g., in the third direction DR3).

The spacer 150 may be disposed below the first gate cut 131. For example, the spacer 150 may be disposed between the first gate cut 131 and the fourth part 174 of the first interlayer insulating layer 170 (e.g., in the third direction DR3). The spacer 150 may also be disposed between an upper surface of the field insulating layer 105 and the fourth part 174 of the first interlayer insulating layer 170 (e.g., in the third direction DR3).

The spacer 150 may extend in the third direction DR3 along the sidewalls of each of the first to fifth gate structures 121, 122, 123, 124 and 125. For example, the spacer 150 may be disposed directly between the oxide layer 140 and the first interlayer insulating layer 170. The spacer 150 may extend in the third direction DR3 along the sidewalls of each of the first and second gate cuts 131 and 132.

The spacer 150 may directly contact the sidewalls of the first active pattern 101 as shown in the exemplary embodiments of FIGS. 3 and 4. However, exemplary embodiments of the present inventive concepts are not limited thereto. The spacer 150 may contact the bottom surface of each of the first to fifth gate structures 121, 122, 123, 124, and 125. However, exemplary embodiments of the present inventive concepts are not limited thereto.

In an exemplary embodiment, the spacer 150 may include at least one compound selected from silicon nitride (SiN), silicon oxycarbide (SiOC), and silicon carbide (SiC). However, exemplary embodiments of the present inventive concepts are not limited thereto.

The second interlayer insulating layer 180 may be disposed on the first interlayer insulating layer 170. For example, as shown in the exemplary embodiment of FIG. 3, a lower surface of the second interlayer insulating layer 180 may directly contact an upper surface of the first interlayer insulating layer 170. The second interlayer insulating layer 180 may cover the upper surface of each of the first to fifth gate structures 121, 122, 123, 124, and 125, and the upper surface of each of the first and second gate cuts 131 and 132. In an exemplary embodiment, the second interlayer insulating layer 180 may include at least one compound selected from silicon oxide ($SiO_2$), silicon nitride (SiN), and silicon oxynitride (SiON).

The source/drain contact 165 may extend in the third direction DR3 into the source/drain region 160 through the second interlayer insulating layer 180 and the first interlayer insulating layer 170. The silicide layer 161 may be disposed between the source/drain contact 165 and the source/drain region 160.

The semiconductor device according to some exemplary embodiments of the present inventive may have enhanced reliability by preventing the field insulating layer 105 from being excessively etched out during the process of forming the gate cuts 131 and 132 by disposing the spacer 150 below each of the gate structures 121 and 124 and the gate cuts 131 and 132.

Hereinafter, a semiconductor device according to some other exemplary embodiments of the present inventive concepts will be described with reference to FIGS. 5 and 6. Differences from the semiconductor device shown in FIGS. 2 to 4 will be mainly described and a description of substantially identical elements will be omitted for convenience of explanation.

Figure 5:
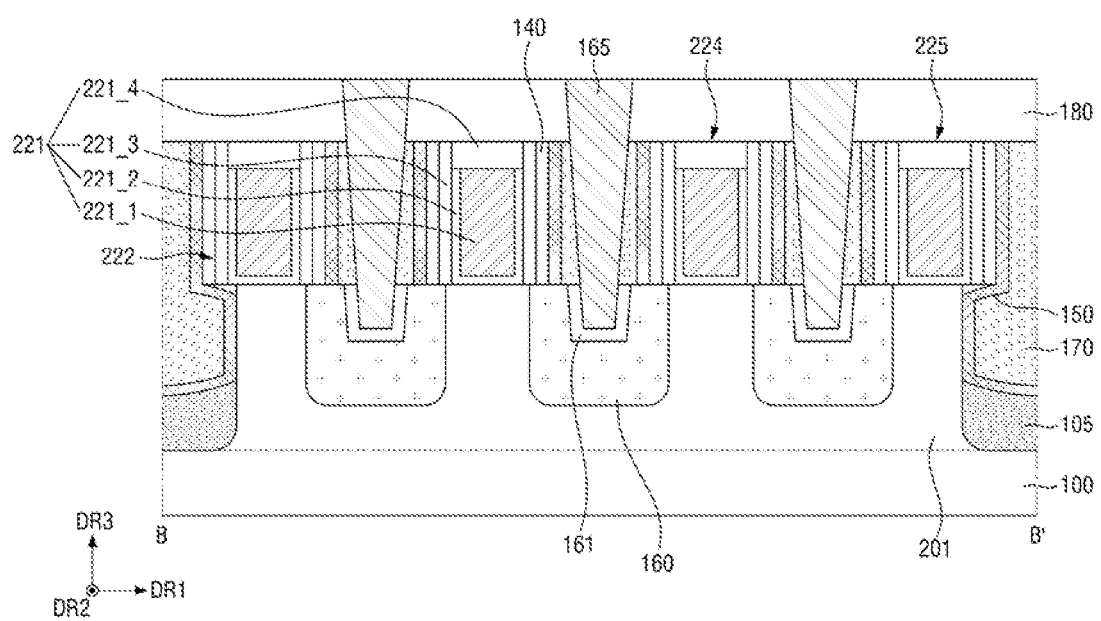
FIGS. 5 and 6 are cross-sectional views illustrating semiconductor devices taken along lines B-B' and C-C' of FIG. 1, respectively, according to some other exemplary embodiments of the present inventive concepts.
Figure 6:
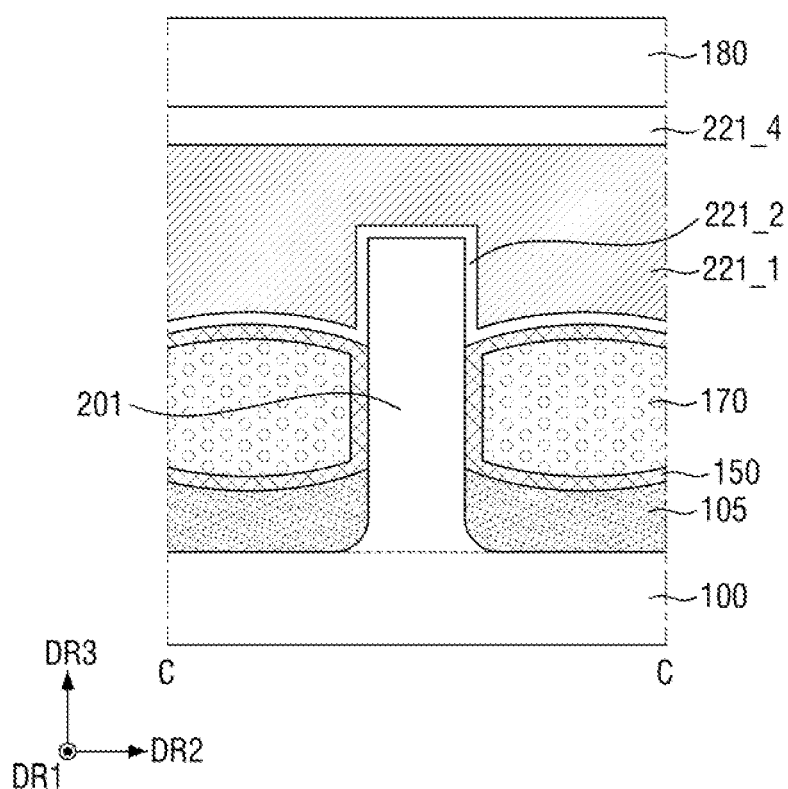

FIGS. 5 and 6 are cross-sectional views illustrating a semiconductor device according to some other exemplary embodiments of the present inventive concepts.

With reference to FIGS. 5 and 6, the semiconductor device according to some other exemplary embodiments of the present inventive concepts may have a FinFET structure.

A first gate structure 221 may be disposed on a first active pattern 201. The first gate structure 221 may include a gate electrode 221_1, a gate insulating layer 221_2, a gate spacer 221_3, and a capping pattern 221_4.

The gate electrode 221_1 may be disposed on the first active pattern 201 and may extend in the second direction DR2. The gate insulating layer 221_2 may be disposed along the sidewalls and bottom surface of the gate electrode 221_1. The capping pattern 221_4 may be disposed on the upper surface of the gate electrode 221_1 and the upper surface of the gate insulating layer 221_2. The gate spacer 221_3 may extend in the second direction DR2 along the outer sidewalls of the gate insulating layer 221_2 and the sidewalls of the capping pattern 221_4. The source/drain region 160 may be disposed inside the first active pattern 201. For example, sidewalls and a bottom surface of the source/drain region 160 may be in direct contact with the first active pattern 201.

The second gate structure 222, the fourth gate structure 224, and the fifth gate structure 225 may each be similar in structure to the first gate structure 221.

Hereinafter, a semiconductor device according to some other exemplary embodiments of the present inventive concepts will be described with reference to FIG. 7. Differences from the semiconductor device shown in the exemplary embodiments of FIGS. 2 to 4 will be mainly described and a description of substantially identical elements will be omitted for convenience of explanation.

Figure 7:
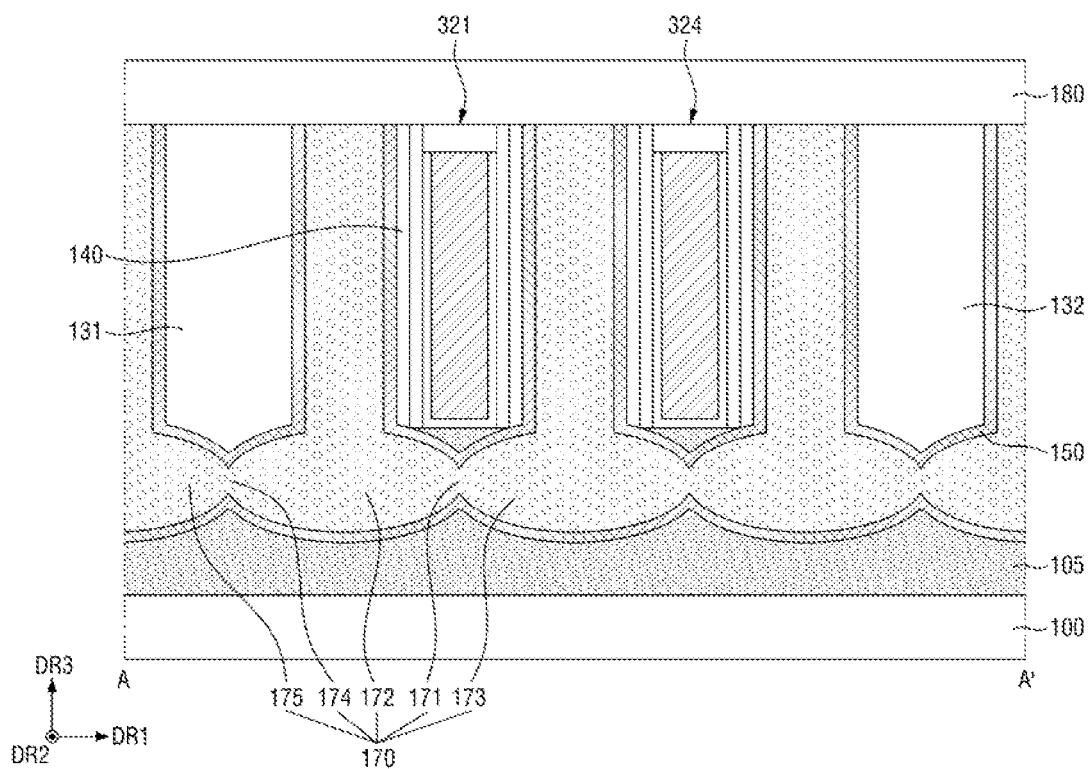
FIG. 7 is a cross-sectional view illustrating a semiconductor device taken along line A-A' of FIG. 1 according to some other exemplary embodiments of the present inventive concepts.

FIG. 7 is a cross-sectional view illustrating a semiconductor device according to some other exemplary embodiments of the present inventive concepts.

With reference to FIG. 7, the semiconductor device according to some other exemplary embodiments of the present inventive concepts may have the field insulating layer 105 disposed between the first gate structure 321 and the spacer 150 and between the fourth gate structure 324 and the spacer 150. For example as shown in the exemplary embodiment of FIG. 7, the bottom surface of the first gate structure 321 and the bottom surface of the fourth gate structure 324 may each directly contact a portion of the field insulating layer 105. The field insulating layer 105 may be further disposed between the spacer 150 disposed on a bottom surface of the first interlayer insulating layer 170 and the substrate 100 (e.g., in the third direction DR3) similar to the exemplary embodiment of FIG. 2.

Hereinafter, a semiconductor device according to still other exemplary embodiments of the present inventive concepts will be described with reference to FIG. 8. Differences from the semiconductor device shown in the exemplary embodiments of FIGS. 2 to 4 will be mainly described and a description of substantially identical elements will be omitted for convenience of explanation.

Figure 8:
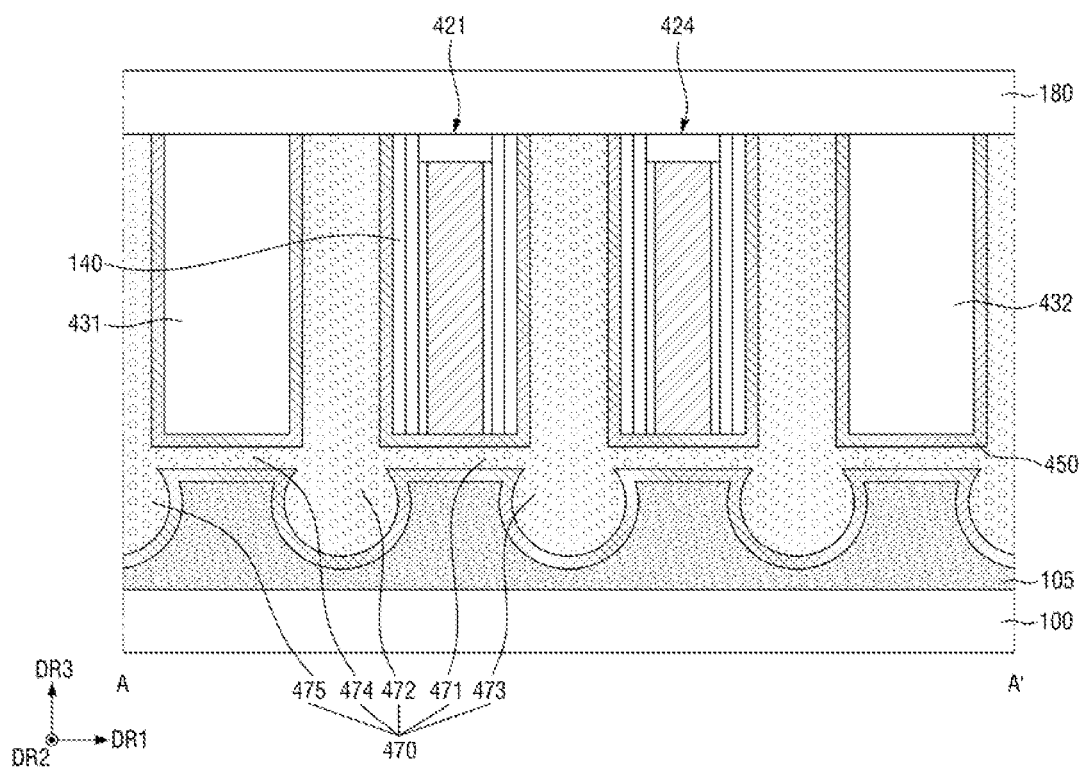
FIG. 8 is a cross-sectional view illustrating a semiconductor device taken along line A-A' of FIG. 1 according to another exemplary embodiment of the present inventive concepts.

FIG. 8 is a cross-sectional view illustrating a semiconductor device according to still other exemplary embodiments of the present inventive concepts.

With reference to FIG. 8, the semiconductor device according to some other exemplary embodiments of the present inventive concepts may include a first gate structure 421, a fourth gate structure 424, a first gate cut 431, and a second gate cut 432 that are disposed on a first interlayer insulating layer 470. Each of the first gate structure 421, the fourth gate structure 424, the first gate cut 431, and the second gate cut 432 may have a bottom surface having a substantially planar shape. For example, as shown in the exemplary embodiment of FIG. 8, the bottom surfaces of the first gate structure 421, the fourth gate structure 424, the first gate cut 431, and the second gate cut 432 may extend substantially in the first direction DR1.

The spacer 450 may be disposed along the bottom surface of each of the first gate structure 421, the fourth gate structure 424, the first gate cut 431, and the second gate cut 432.

The second part 472 of the first interlayer insulating layer 470, the third part 473 of the first interlayer insulating layer 470, and the fifth part 475 of the first interlayer insulating layer 470 may each be arranged to be recessed into the field insulating layer 105. As shown in the exemplary embodiment of FIG. 8, the second part 472 of the first interlayer insulating layer 470, the third part 473 of the first interlayer insulating layer 470, and the fifth part 475 of the first interlayer insulating layer 470 may each be recessed into the field insulating layer 105 in a spherical shape in a plan view (e.g., in a plane defined in the first and third directions DR1, DR3).

The first part 471 of the first interlayer insulating layer 470 may connect the upper portion of the second part 472 of the first interlayer insulating layer 470 to the upper portion of the third part 473 of the first interlayer insulating layer 470. The fourth part 474 of the first interlayer insulating layer 470 may connect the upper portion of the second part 472 of the first interlayer insulating layer 470 to the upper portion of the fifth part 475 of the first interlayer insulating layer 470. As shown in the exemplary embodiment of FIG. 8, the first part 471 and the fourth part 474 of the first interlayer insulating layer 470 may be substantially rectangular shaped (e.g., in a plane defined in the first and third directions DR1, DR3).

Hereinafter, a semiconductor device according to still other exemplary embodiments of the present inventive concepts will be described with reference to FIG. 9. Differences from the semiconductor device shown in FIGS. 2 to 4 will be mainly described and a description of substantially identical elements will be omitted for convenience of explanation.

Figure 9:
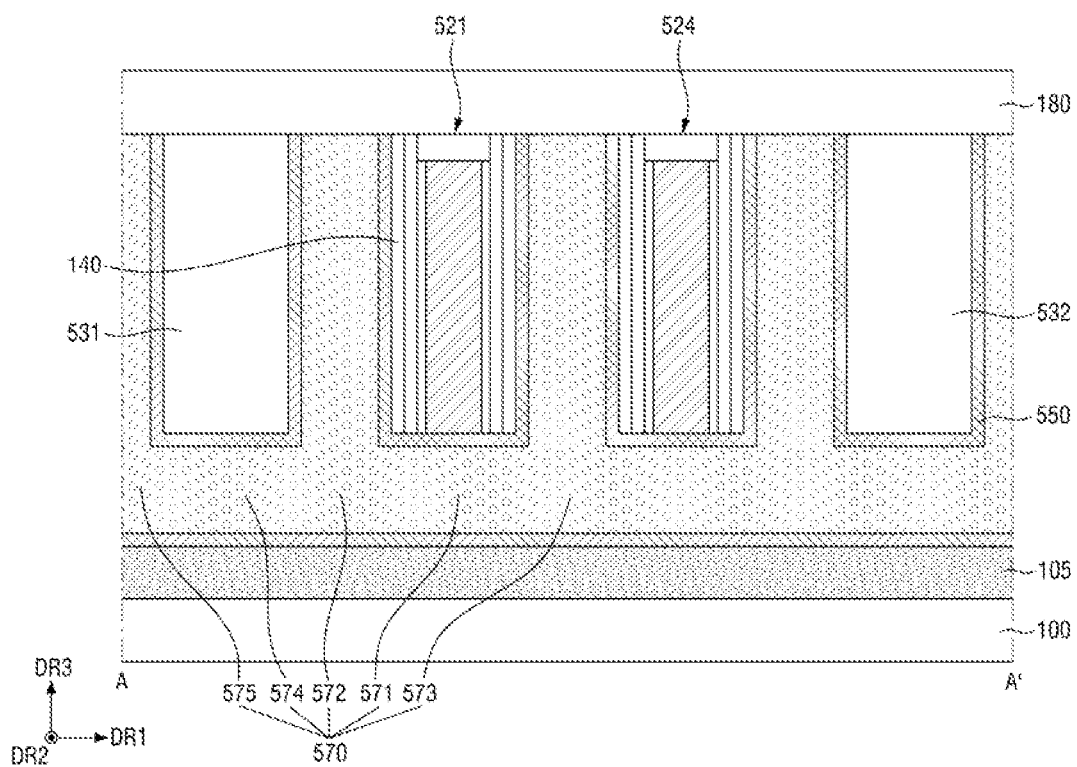
FIG. 9 is a cross-sectional view illustrating a semiconductor device taken along line A-A' of FIG. 1 according to another exemplary embodiment of the present inventive concepts.

FIG. 9 is a cross-sectional view illustrating a semiconductor device according to still other exemplary embodiments of the present inventive concepts.

With reference to FIG. 9, the semiconductor device according to some other exemplary embodiments of the present inventive concepts may include a first gate structure 521, a fourth gate structure 524, a first gate cut 531, and a second gate cut 532 that are disposed on a first interlayer insulating layer 570. Each of the first gate structure 521, the fourth gate structure 524, the first gate cut 531, and the second gate cut 532 have a bottom surface having a substantially planar shape. For example, as shown in the exemplary embodiment of FIG. 9, the bottom surfaces of the first gate structure 521, the fourth gate structure 524, the first gate cut 531, and the second gate cut 532 may extend substantially in the first direction DR1.

The spacer 550 may be disposed along the bottom surface of each of the first gate structure 521, the fourth gate structure 524, the first gate cut 531, and the second gate cut 532. The spacer 550 may also be disposed in a flat plate shape between a lower surface of the first interlayer insulating layer 570 and an upper surface of the field insulating layer 105 (e.g., in the third direction DR3) and a lower surface of the first interlayer insulating layer 570 may directly contact the upper surface of the field insulating layer 105.

The first part 571 of the first interlayer insulating layer 570 may connect the second part 572 of the first interlayer insulating layer 570 to the third part 573 of the first interlayer insulating layer 570. The fourth part 574 of the first interlayer insulating layer 570 may connect the second part 572 of the first interlayer insulating layer 570 to the fifth part 575 of the first interlayer insulating layer.

Hereinafter, a semiconductor device according to still other exemplary embodiments of the present inventive concepts will be described with reference to FIG. 10. Differences from the semiconductor device shown in the exemplary embodiment of FIG. 7 will be mainly described and a description of substantially identical elements will be omitted for convenience of explanation.

Figure 10:
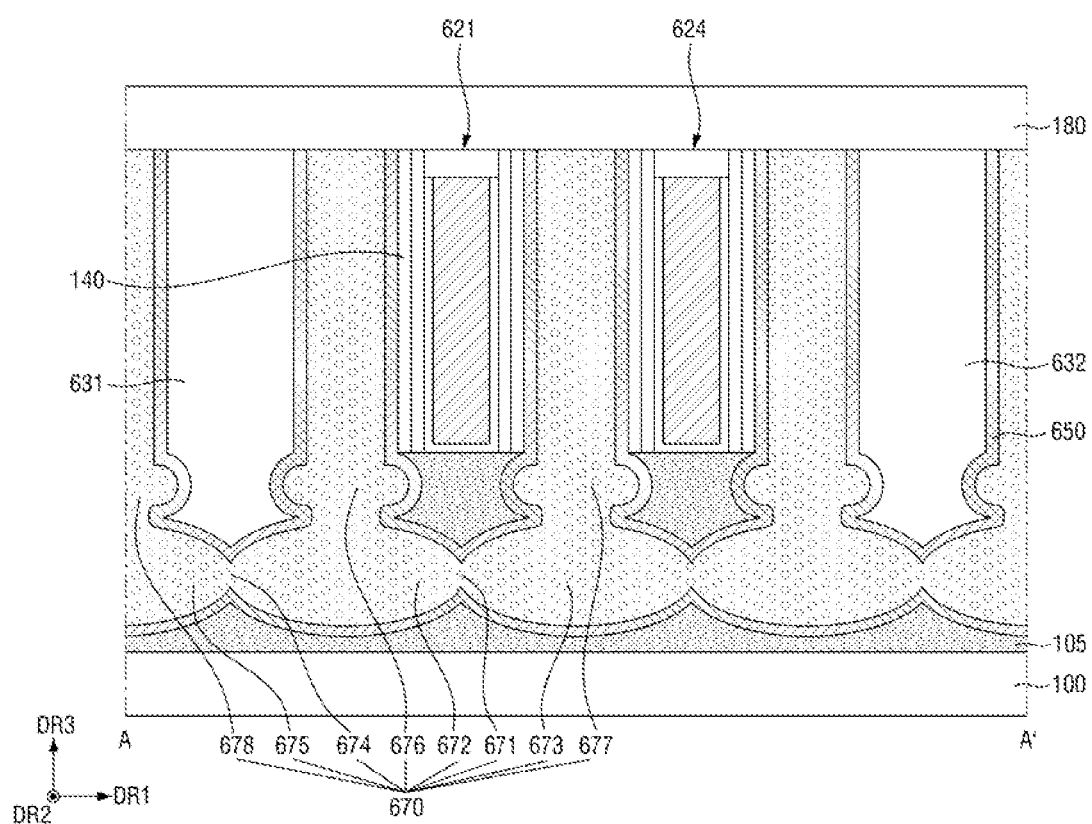
FIG. 10 is a cross-sectional view illustrating a semiconductor device taken along line A-A' of FIG. 1 according to another exemplary embodiment of the present inventive concepts.

FIG. 10 is a cross-sectional view illustrating a semiconductor device according to still other exemplary embodiments of the present inventive concepts.

With reference to FIG. 10, the semiconductor device according to some other exemplary embodiments of the present inventive concepts may include the field insulating layer 105 disposed between the first gate structure 621 and the spacer 650 and between the fourth gate structure 624 and the spacer 650. In this exemplary, the bottom surface of each of the first gate structure 621 and the fourth gate structure 624 may each directly contact an upper surface of the field insulating layer 105.

The first interlayer insulating layer 670 may include first to eighth parts 671, 672, 673, 674, 675, 676, 677, and 678.

The sixth part 676 of the first interlayer insulating layer 670 may be disposed on the second part 672 of the first interlayer insulating layer 670 (e.g., in the third direction DR3). The sixth part 676 of the first interlayer insulating layer 670 may overlap the second part 672 of the first interlayer insulating layer 670 in the third direction DR3.

The seventh part 677 of the first interlayer insulating layer 670 may be disposed on the third part 673 of the first interlayer insulating layer 670 (e.g., in the third direction DR3). The seventh part 677 of the first interlayer insulating layer 670 may overlap the third part 673 of the first interlayer insulating layer 670 in the third direction DR3.

The eighth part 678 of the first interlayer insulating layer 670 may be disposed on the fifth part 675 of the first interlayer insulating layer 670 (e.g., in the third direction DR3). The eighth part 678 of the first interlayer insulating layer 670 may overlap the fifth part 675 of the first interlayer insulating layer 670 in the third direction DR3.

The field insulating layer 105 may be disposed between the sixth part 676 of the first interlayer insulating layer 670 and the seventh part 677 of the first interlayer insulating layer 670 (e.g., in the first direction DR1) and between the sixth part 676 of the first interlayer insulating layer 670 and the eighth part 678 of the first interlayer insulating layer 670 (e.g., in the first direction DR1).

The sixth part 676 of the first interlayer insulating layer 670 may be arranged to protrude toward the first gate cut 631 (e.g., in the first direction DR1). As shown in the exemplary embodiment of FIG. 10, the first interlayer insulating layer 670 may be arranged to protrude towards the first gate cut 631 in a convex shape. The sixth part 676 of the first interlayer insulating layer 670 may also be arranged to protrude toward the field insulating layer 105 disposed under the first gate structure 621 in the first direction DR1. The sixth part 676 may be arranged to protrude toward the field insulating layer 105 disposed under the first gate structure 621 in a convex shape.

The seventh part 677 of the first interlayer insulating layer 670 may be arranged to protrude toward the field insulating layer 105 disposed under the first gate structure 621 in the first direction DR1. As shown in the exemplary embodiment of FIG. 10, the seventh part 677 may be arranged to protrude towards the field insulating layer 105 disposed under the first gate structure 621 in a convex shape. The eighth part 678 of the first interlayer insulating layer 670 may be arranged to protrude toward the first gate cut 631 in the first direction DR1. The eighth part 678 may be arranged to protrude toward the first gate cut 631 in a convex shape. However, in other exemplary embodiments, the protrusions of the first interlayer insulating layer 670 may have various different shapes.

Although it is illustrated in the exemplary embodiment of FIG. 10 that the seventh part 677 of the first interlayer insulating layer 670 does not overlap either the gate electrode of the first gate structure 621 or the gate electrode of the fourth gate structure 624 in the third direction DR3, exemplary embodiments of the present inventive concepts are not limited thereto. For example, in some other exemplary embodiments, the seventh part 677 of the first interlayer insulating layer 670 may overlap the gate electrode of the first gate structure 621 and the gate electrode of the fourth gate structure in the third direction DR3. In this embodiment, the sixth part 676 of the first interlayer insulating layer 670 and the eighth part 678 of the first interlayer insulating layer 670 may each be similar in structure to the seventh part 677 of the first interlayer insulating layer 670.

The spacer 650 may be disposed between the sixth part 676 of the first interlayer insulating layer 670 and the field insulating layer 105 disposed under the first gate structure 621 (e.g., in the first direction DR1), between the sixth part 676 of the first interlayer insulating layer 670 and the first gate cut 631 (e.g., in the first direction DR1), between the seventh part 677 of the first interlayer insulating layer 670 and the field insulating layer 105 disposed under the first gate structure 621 (e.g., in the first direction DR1), and between the eighth part 678 of the first interlayer insulating layer 670 and the first gate cut 631 (e.g., in the first direction DR1). The second gate cut 632 may be similar in structure to the first gate cut 631.

Hereinafter, a semiconductor device according to still other exemplary embodiments of the present inventive concepts will be described with reference to FIG. 11. Differences from the semiconductor device shown in FIG. 10 will be mainly described and a description of substantially identical elements will be omitted for convenience of explanation.

Figure 11:
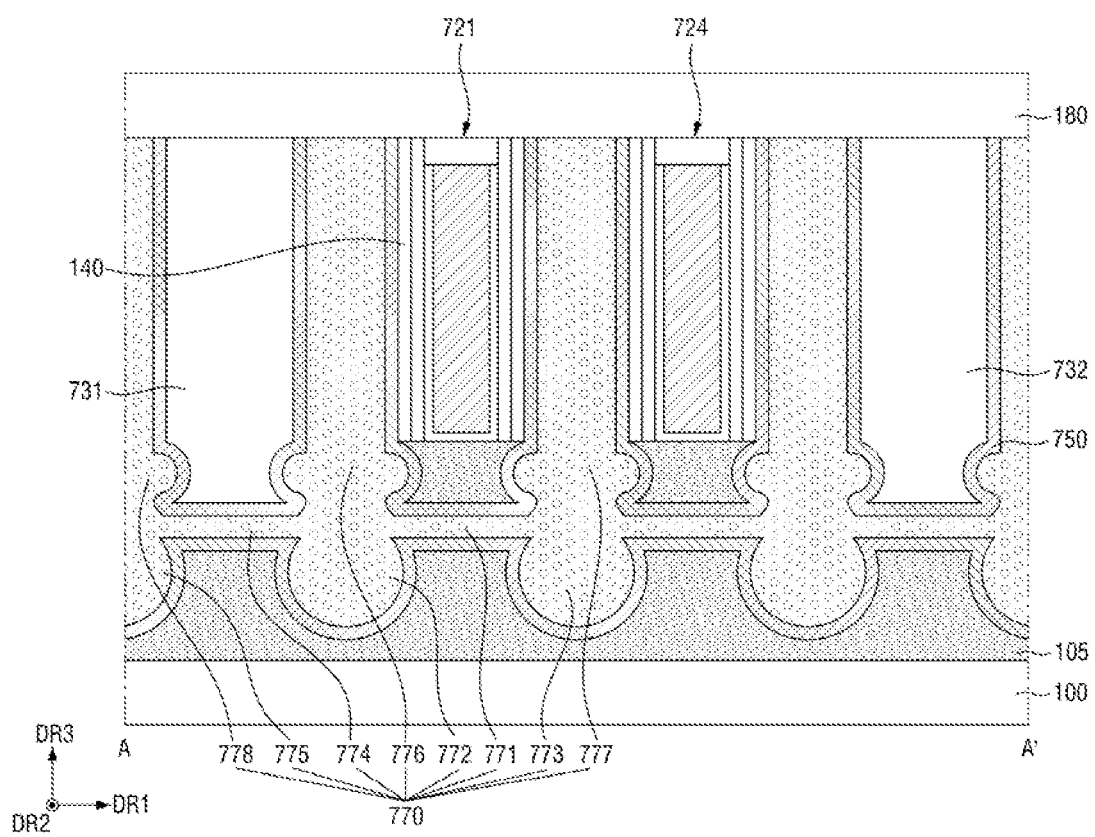
FIG. 11 is a cross-sectional view illustrating a semiconductor device taken along line A-A' of FIG. 1 according to another exemplary embodiment of the present inventive concepts.

FIG. 11 is a cross-sectional view illustrating a semiconductor device according to still other exemplary embodiments of the present inventive concepts.

With reference to FIG. 11, the semiconductor device according to some exemplary embodiments of the present inventive concepts may include a field insulating layer 105 disposed between the first gate structure 721 and the spacer 750 and between the fourth gate structure 724 and the spacer 750.

As shown in the exemplary embodiment of FIG. 11, the second part 772 of the first interlayer insulating layer 770, the third part 773 of the first interlayer insulating layer 770, the fifth part 775 of the first interlayer insulating layer 770 may each be recessed into the field insulating layer 105. For example, as shown in the exemplary embodiment of FIG. 11, the second part 772 of the first interlayer insulating layer 770, the third part 773 of the first interlayer insulating layer 770 and the fifth part 775 of the first interlayer insulating layer 770 may each be recessed into the field insulating layer 105 in a spherical shape.

The first part 771 of the first interlayer insulating layer 770 may be substantially rectangular shaped (e.g., in a plane defined in the first and third directions DR1, DR3) and may connect the upper portion of the second part 772 of the first interlayer insulating layer 770 to the upper portion of the third part 773 of the first interlayer insulating layer 770. The fourth part 774 of the first interlayer insulating layer 770 may be substantially rectangular shaped (e.g., in a plane defined in the first and third directions DR1, DR3) and may connect the upper portion of the second part 772 of the first interlayer insulating layer 770 to the upper portion of the fifth part 775 of the first interlayer insulating layer 770.

The sixth part 776 of the first interlayer insulating layer 770 may be disposed on the second part 772 of the first interlayer insulating layer 770 (e.g., in the third direction DR3). The seventh part 777 of the first interlayer insulating layer 770 may be disposed on the third part 773 of the first interlayer insulating layer 770 (e.g., in the third direction DR3). The eighth part 778 of the first interlayer insulating layer 770 may be disposed on the fifth part 775 of the first interlayer insulating layer 770 (e.g., in the third direction DR3). The second gate cut 732 may be similar in structure to the first gate cut 731.

Although it is illustrated in FIG. 11 that the seventh part 777 of the first interlayer insulating layer 770 does not overlap either the gate electrode of the first gate structure 721 or the gate electrode of the fourth gate structure 724 in the third direction DR3, exemplary embodiments of the present inventive concepts are not limited thereto. For example, in some other exemplary embodiments, the seventh part 777 of the first interlayer insulating layer 770 may overlap the gate electrode of the first gate structure 721 and the gate electrode of the fourth gate structure 724 in the third direction DR3. In this embodiment, the sixth part 776 of the first interlayer insulating layer 770 and the eighth part 778 of the first interlayer insulating layer 770 may each be similar in structure to the seventh part 777 of the first interlayer insulating layer 770.

Hereinafter, a semiconductor device according to still other exemplary embodiments of the present inventive concepts will be described with reference to FIG. 12. Differences from the semiconductor device shown in FIG. 10 will be mainly described and a description of substantially identical elements will be omitted for convenience of explanation.

Figure 12:
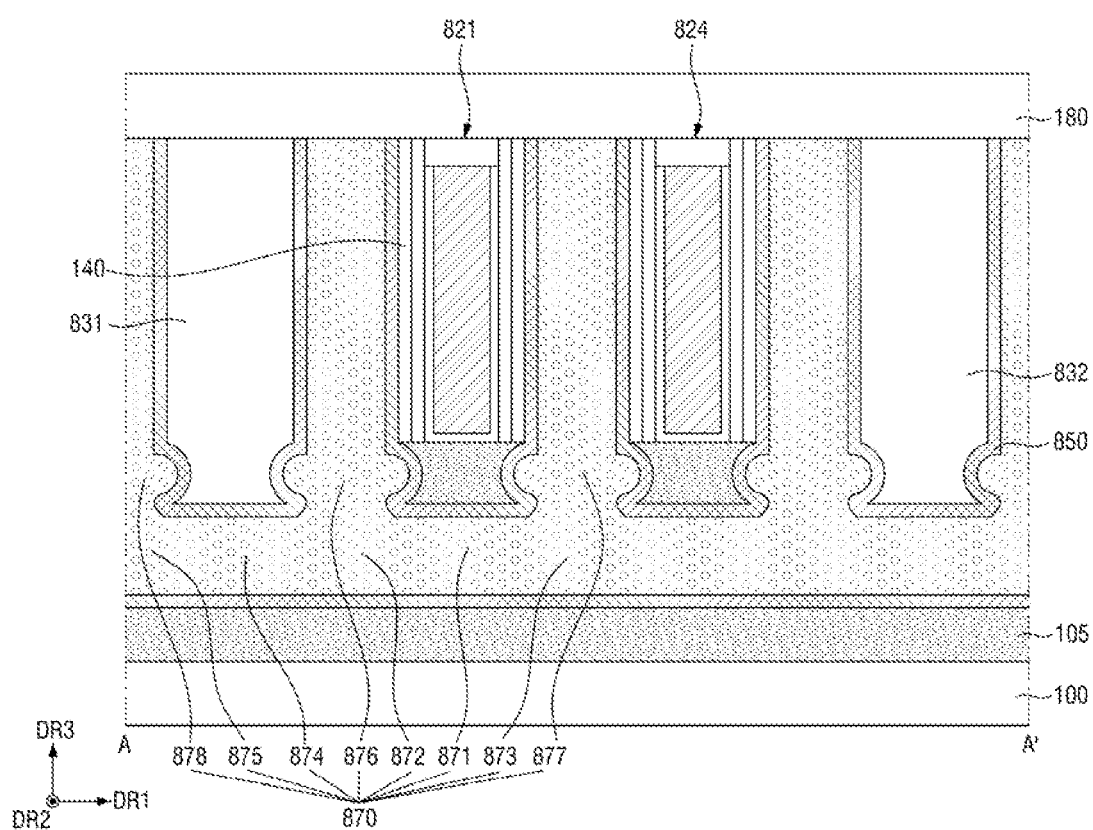
FIG. 12 is a cross-sectional view illustrating a semiconductor device taken along line A-A' of FIG. 1 according to another exemplary embodiment of the present inventive concepts.

FIG. 12 is a cross-sectional view illustrating a semiconductor device according to still other exemplary embodiments of the present inventive concepts.

With reference to FIG. 12, the semiconductor device according to some other exemplary embodiments of the present inventive concepts may include the field insulating layer 105 disposed between the first gate structure 821 and the spacer 850 (e.g., in the third direction DR3) and between the fourth gate structure 824 and the spacer 850 (e.g., in the third direction DR3). A lower portion of the spacer 850 disposed between a lower surface of the first interlayer insulating layer 870 and the field insulating layer 105 may be disposed in a flat shape and may directly contact an upper surface of the field insulating layer 105.

The first part 871 of the first interlayer insulating layer 870 may connect the second part 872 of the first interlayer insulating layer 870 to the third part 873 of the first interlayer insulating layer 870. The fourth part 874 of the first interlayer insulating layer 870 may connect the second part 872 of the first interlayer insulating layer 870 to the fifth part 875 of the first interlayer insulating layer 870.

The sixth part 876 of the first interlayer insulating layer 870 may be disposed on the second part 872 of the first interlayer insulating layer 870 (e.g., in the third direction DR3). The seventh part 877 of the first interlayer insulating layer 870 may be disposed on the third part 873 of the first interlayer insulating layer 870 (e.g., in the third direction DR3). The eighth part 878 of the first interlayer insulating layer 870 may be disposed on the fifth part 875 of the first interlayer insulating layer 870 (e.g., in the third direction DR3). The second gate cut 832 may be similar in structure to the first gate cut 831.

Although it is illustrated in the exemplary embodiment of FIG. 12 that the seventh part 877 of the first interlayer insulating layer 870 does not overlap either the gate electrode of the first gate structure 821 or the gate electrode of the fourth gate structure 824 in the third direction DR3, exemplary embodiments of the present inventive concepts are not limited thereto. For example, in some other exemplary embodiments, the seventh part 877 of the first interlayer insulating layer 870 may overlap the gate electrode of the first gate structure 821 and the gate electrode of the fourth gate structure 824 in the third direction DR3. In this embodiment, the sixth part 876 of the first interlayer insulating layer 870 and the eighth part 878 of the first interlayer insulating layer 870 may each be similar in structure to the seventh part 877 of the first interlayer insulating layer 870.

Hereinafter, a semiconductor device according to still other exemplary embodiments of the present inventive concepts will be described with reference to FIG. 13. Differences from the semiconductor device shown in the exemplary embodiment of FIG. 9 will be mainly described and a description of substantially identical elements will be omitted for convenience of explanation.

Figure 13:
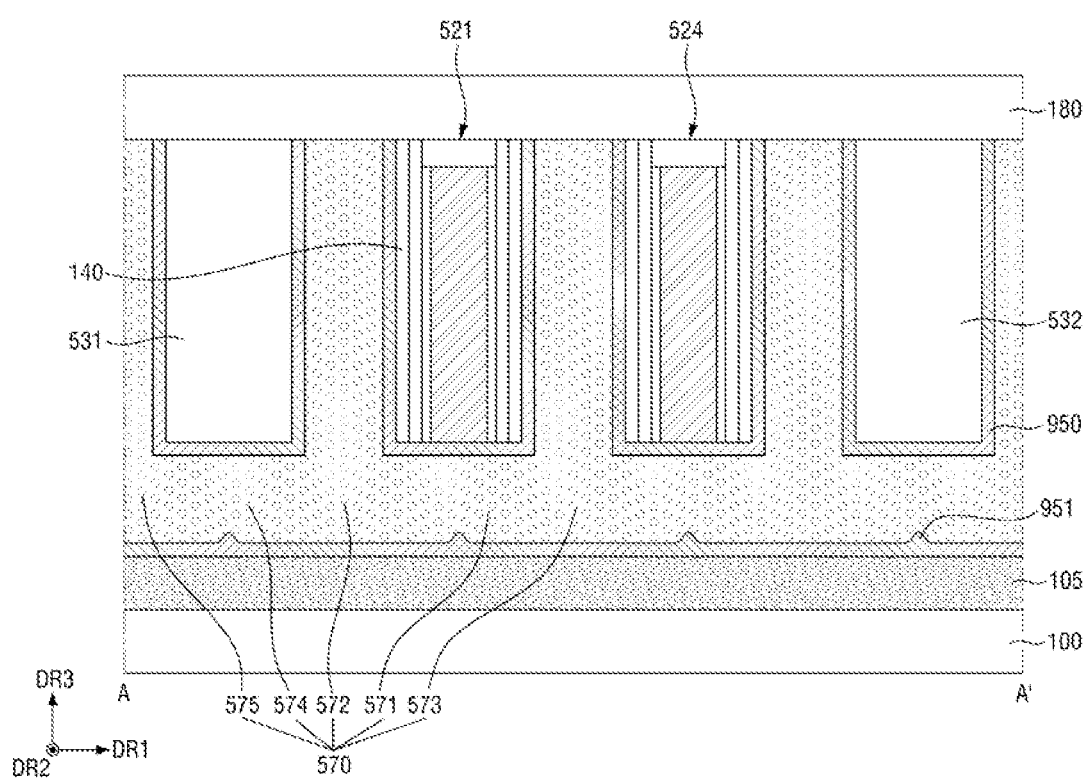
FIG. 13 is a cross-sectional view illustrating a semiconductor device taken along line A-A' of FIG. 1 according to another exemplary embodiment of the present inventive concepts.

FIG. 13 is a cross-sectional view illustrating a semiconductor device according to still other exemplary embodiments of the present inventive concepts.

With reference to FIG. 13, the semiconductor device according to some other exemplary embodiments of the present inventive concepts may include the spacer 950 that is disposed along the upper surface of the field insulating layer 105 and partly protrudes in the third direction DR3.

For example, the protrusion 951 may protrude in the third direction DR3, from the upper surface of the spacer 950 disposed along the upper surface of the field insulating layer 105. As shown in the exemplary embodiment of FIG. 13, the protrusion 951 may overlap each of the first gate structure 521, the fourth gate structure 524, the first gate cut 531, and the second gate cut 532 in the third direction DR3. The protrusions may protrude toward the first gate structure 521, the fourth gate structure 524, the first gate cut 531 and the second gate cut 532 in the third direction DR3. However, exemplary embodiments of the present inventive concepts are not limited thereto and in other exemplary embodiments, the protrusion 951 may not overlap one or more of the first gate structure 521, the fourth gate structure 524, the first gate cut 531, and the second gate cut 532 in the third direction DR3.

Hereinafter, a method of manufacturing a semiconductor device according to some exemplary embodiments of the present inventive concepts will be described with reference to FIGS. 2 and 14 to 20.

Figure 14:
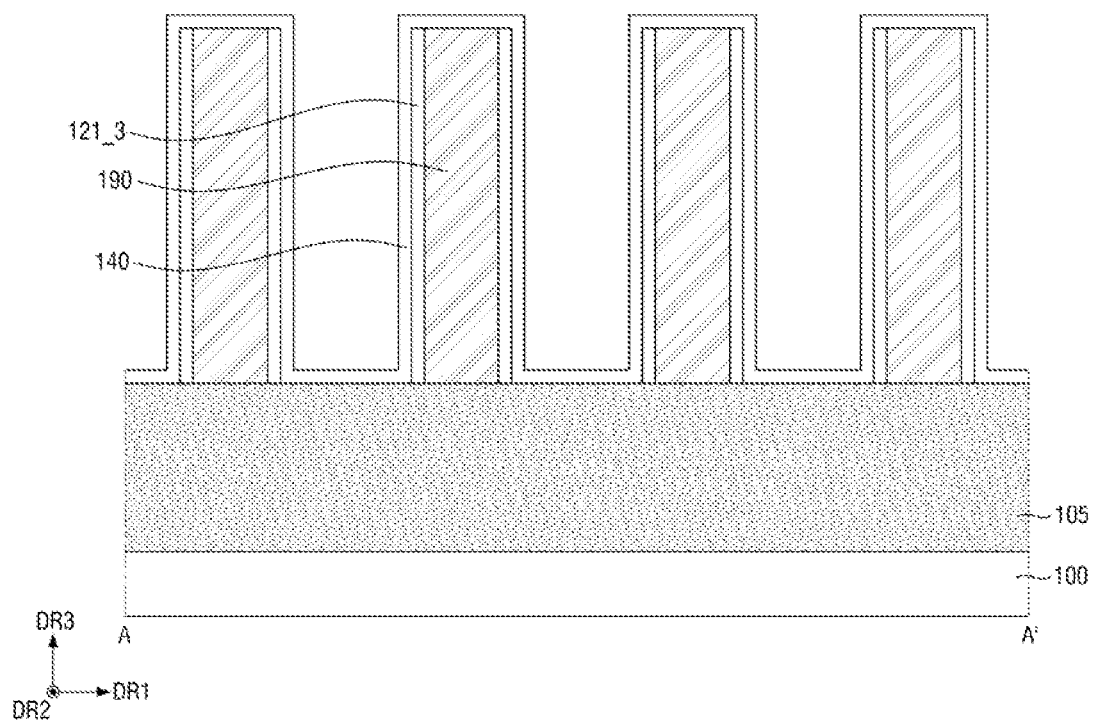
FIGS. 14 to 20 show intermediate steps of a method of manufacturing a semiconductor device according to exemplary embodiments of the present inventive concepts.

With reference to FIG. 14, the field insulating layer 105 may be formed on the substrate 100. For example, a lower surface of the field insulating layer 105 may directly contact an upper surface of the substrate 100. Next, dummy gates 190 may be formed on the field insulating layer 105 and are spaced apart from one another in the first direction DR1 and each extending in the second direction DR2.

Gate spacers 121_3 may then be formed on both sidewalls of the dummy gates 190. The oxide layer 140 may then be conformally formed on the upper surface of the field insulating layer 105, the upper surfaces and sidewalls of the gate spacers 121_3, and the upper surfaces of the dummy gates 190.

Figure 15:
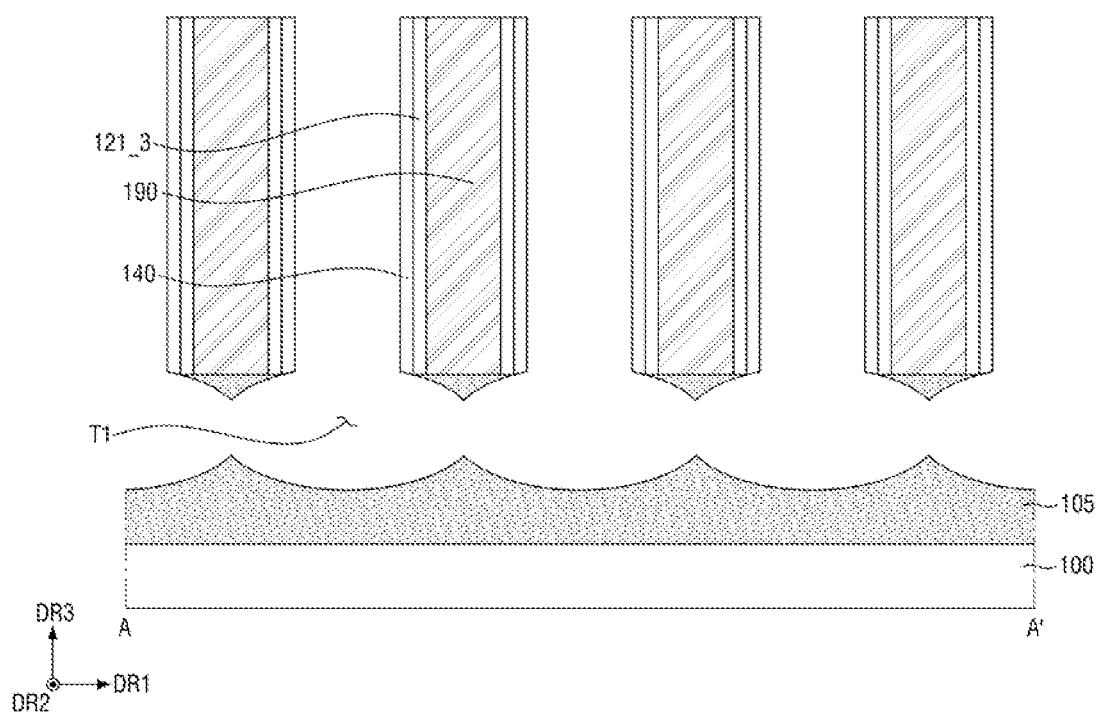

With reference to the exemplary embodiment of FIG. 15, the first trench T1 may be formed inside the field insulating layer 105 by etching the field insulating layer 105 using the dummy gates 190, the gate spacers 121_3, and the oxide layer 140 as a mask. In this exemplary embodiment, a partial portion of the field insulating layer 105 may be left on the dummy gates 190. For example, as shown in the exemplary embodiment of FIG. 15, a partial portion of the field insulating layer 105 remains on a bottom surface of the dummy gates 190.

Figure 16:
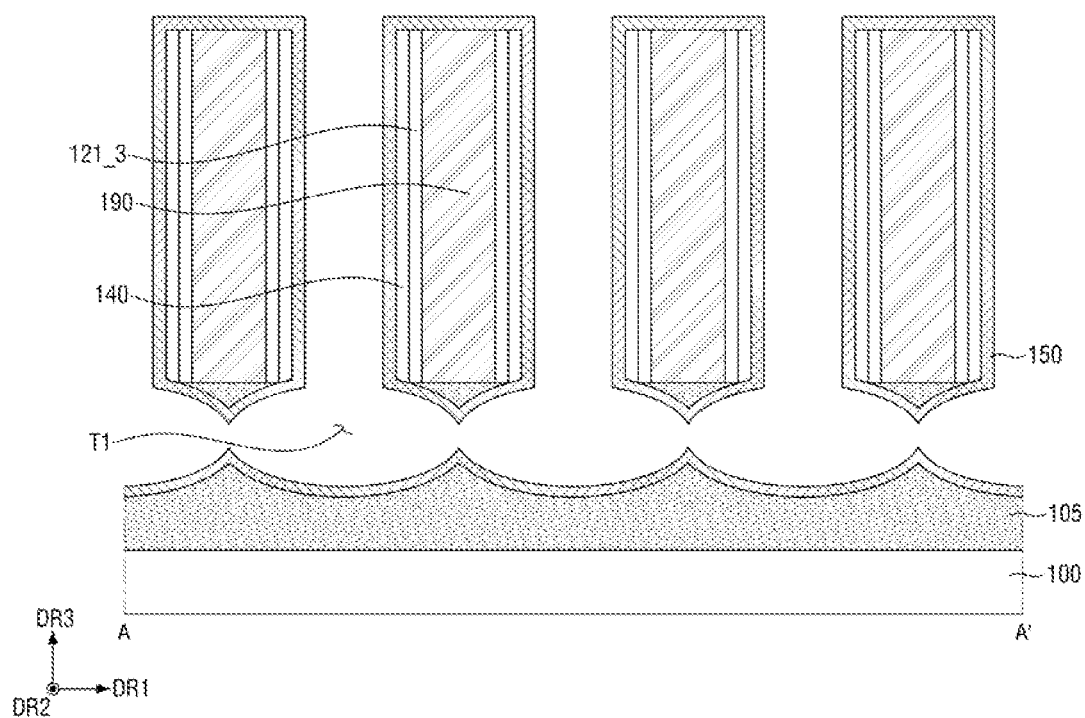

With reference to FIG. 16, the spacer 150 may be conformally formed on the upper surface of the field insulating layer 105 formed on the upper surface of the substrate 100, the lower surface of the field insulating layer 105 formed below the bottom surface of the dummy gates 190, the sidewalls and upper and lower surfaces of the oxide layer 140, and the upper surface of the dummy gates 190.

Figure 17:
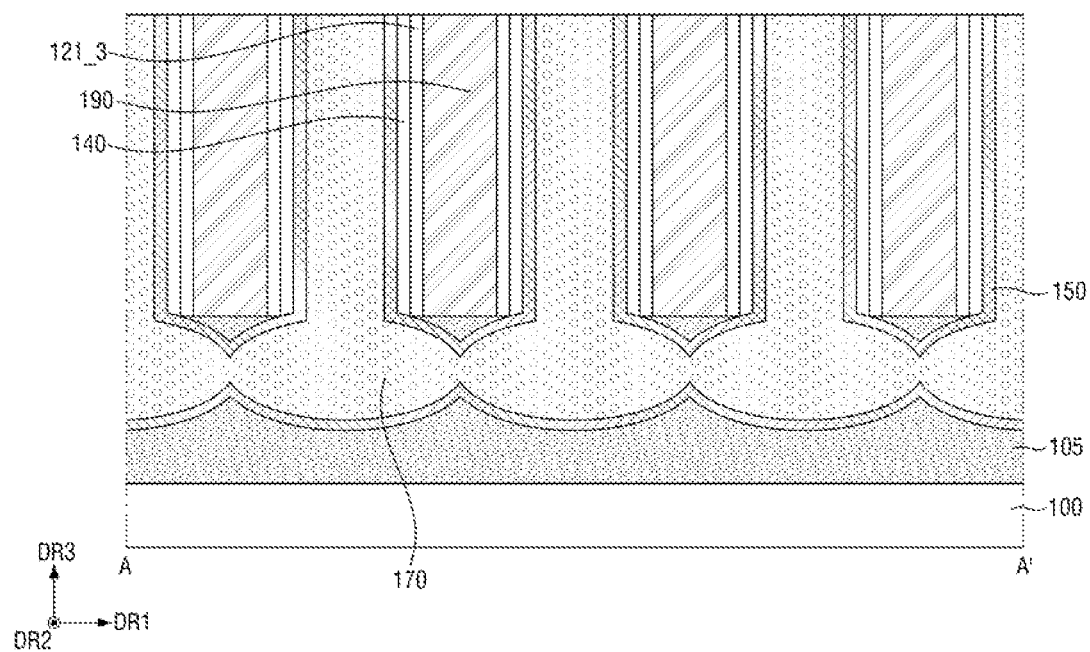

With reference to the exemplary embodiment of FIG. 17, the first interlayer insulating layer 170 may be formed to completely fill the first trench (T1 in FIG. 16) on the spacer 150. The spacer 150 may then be formed on the upper surfaces of the dummy gates 190 and the first interlayer insulating layer 170 may be etched through a planarization process (e.g., CMP process) such that the upper surfaces of the dummy gates 190 are exposed.

With reference to the exemplary embodiment of FIG. 18, the dummy gates 190 and the field insulating layer 105 formed below the bottom surface of the dummy gates 190 may be removed. As a consequence, second trenches T2 are formed in the regions where the dummy gates 190 were previously disposed.

Figure 18:
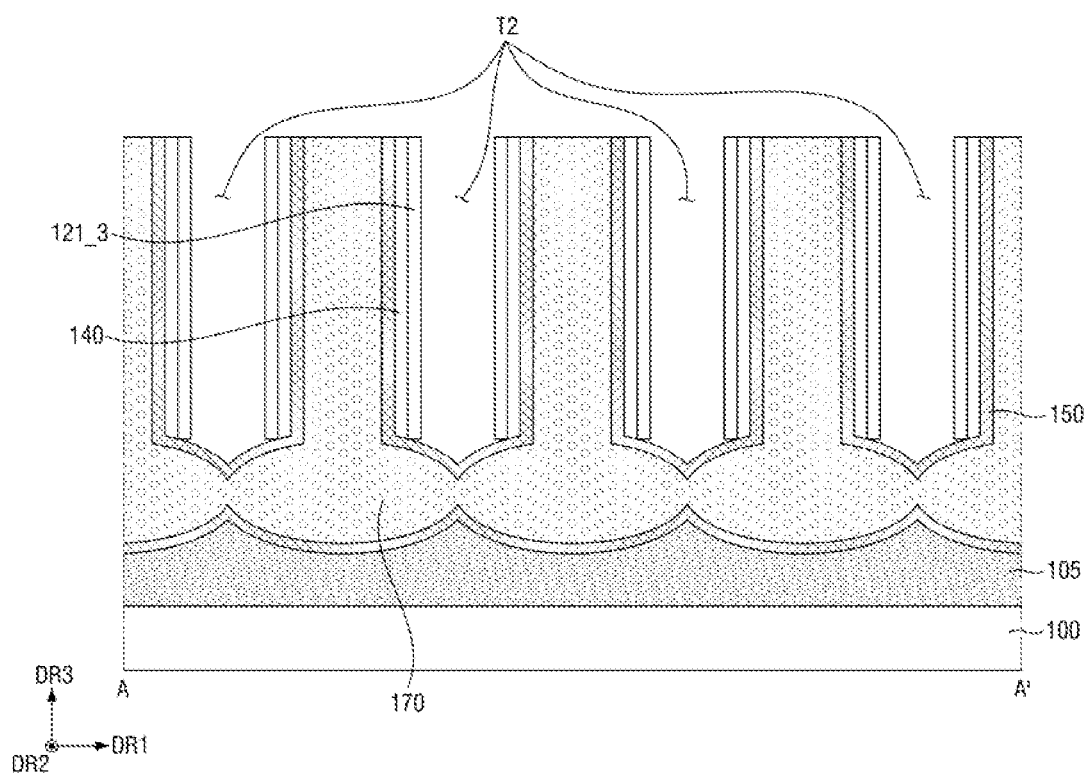
Figure 19:
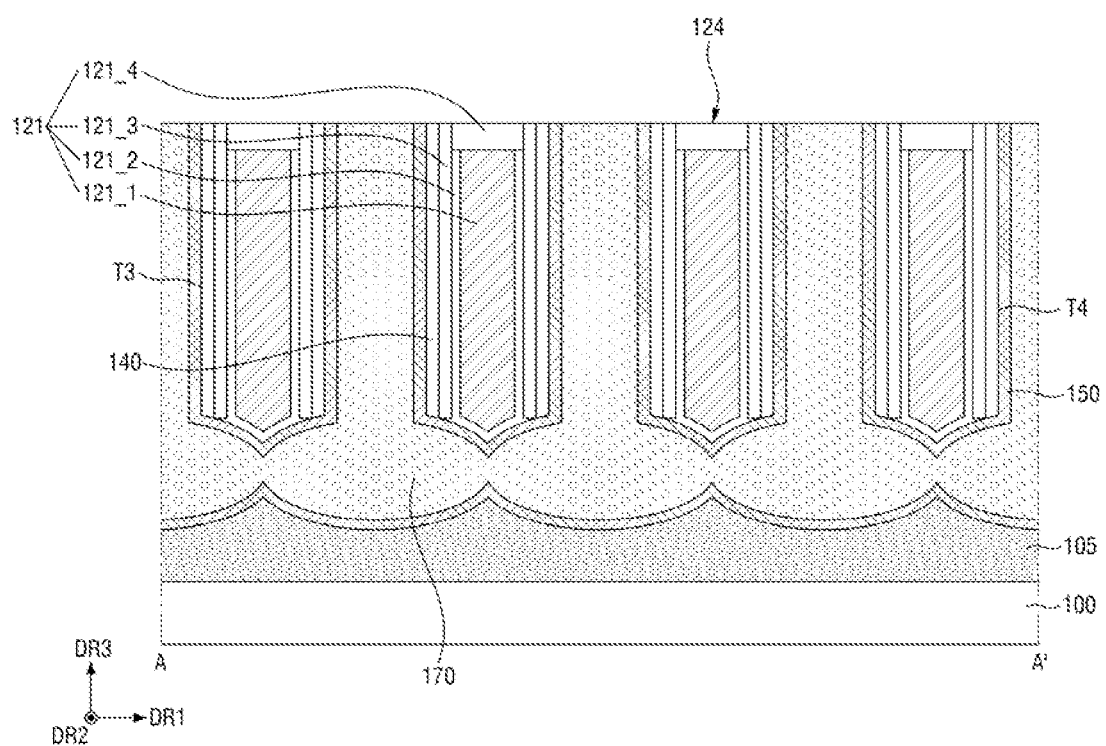

With reference to the exemplary embodiment of FIG. 19, the gate electrode 121_1, the gate insulating layer 121_2, and the capping pattern 121_4 may be formed inside the second trenches (T2 in FIG. 18).

Figure 20:
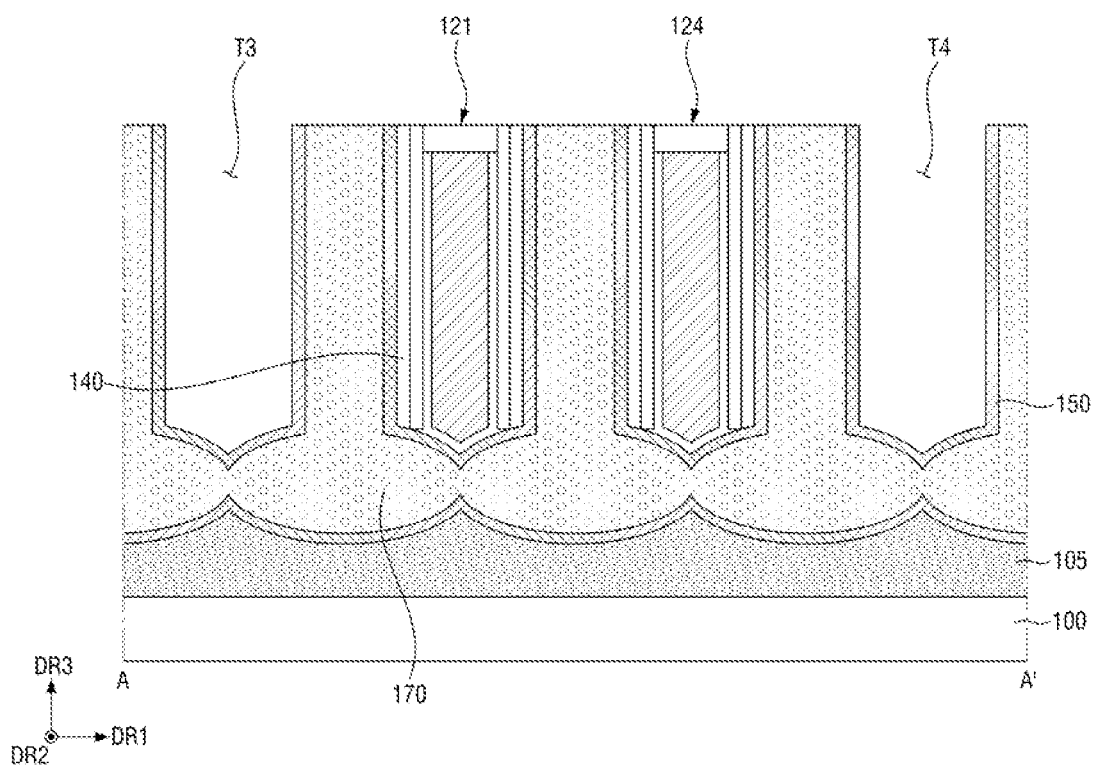

With reference to the exemplary embodiment of FIG. 20, the oxide layer 140 the gate electrode 121_1, the gate insulating layer 121_2, the gate spacer 121_3, and the capping pattern 121_4 formed in each of a third trench T3 and a fourth trench T4 may be removed. However, exemplary embodiments of the present inventive concepts are not limited thereto. For example, in other exemplary embodiments, the oxide layer 140 formed in each of the third trench T3 and the fourth trench T4 may not be removed. According to some other exemplary embodiments, the oxide layer 140 and the gate spacer 121_3 formed in each of the third trench T3 and the fourth trench T4 may not be removed.

The first gate cut 131 may then be formed on the spacer 150 to fill the inside of the third trench T3. The second gate cut 132 may be formed on the spacer 150 to fill the inside of the fourth trench T4.

The second interlayer insulating layer 180 may then be formed to cover the first interlayer insulating layer 170, the first gate structure 121, the fourth gate structure 124, the first gate cut 131, and the second gate cut 132. The semiconductor device shown in FIG. 2 may be fabricated through this process.

In concluding the detailed description of exemplary embodiments, those skilled in the art will appreciate that many variations and modifications can be made to the described exemplary embodiments without substantially departing from the principles of the present inventive concepts. Therefore, the disclosed exemplary embodiments of the present inventive concepts are used in a generic and descriptive sense only and not for purposes of limitation.

What is claimed is:

1. A semiconductor device comprising:
first and second active patterns each extending in a first direction and spaced apart from each other in a second direction that is perpendicular to the first direction;
a field insulating layer disposed between the first active pattern and the second active pattern;
a first gate structure disposed on the first active pattern and extending in the second. direction;
an interlayer insulating layer disposed between the first gate structure and the field insulating layer, the interlayer insulating layer including a first part disposed below the first gate structure; and
a spacer disposed between the first gate structure and the first part of the interlayer insulating layer, wherein an upper surface of the spacer has a height that is greater than a height of lowermost surface of the first gate structure.

2. The semiconductor device of claim 1, wherein the spacer is further disposed between the field insulating layer and the interlayer insulating layer.

3. The semiconductor device of claim 1, wherein:
the interlayer insulating layer further includes a second part disposed on a first lateral side of the first part, and a third part disposed on a second lateral side of the first part that is opposite to the first lateral side of the first part; and
the first part of the interlayer insulating layer is disposed between the second part of the interlayer insulating layer and the third part of the interlayer insulating layer and is configured to connect the second part of the interlayer insulating layer to the third part of the interlayer insulating layer.

4. The semiconductor device of claim 1, further comprising:
a second gate structure disposed on the first active pattern and extending in the second direction, the second gate structure is spaced apart from the first gate structure in the first direction;
a third gate structure disposed on the second active pattern and extending in the second direction, the third gate structure is spaced apart from the second gate structure in the second direction; and
a gate cut disposed on the field insulating layer and positioned between the second gate structure and the third gate structure, wherein the interlayer insulating layer is disposed between the gate cut and the field insulating layer.

5. The semiconductor device of claim 4, wherein the spacer is further disposed between the gate cut and the interlayer insulating layer.

6. The semiconductor device of claim 1, further comprising:
a plurality of nanosheets disposed on the first active pattern and sequentially stacked in a third direction that is perpendicular to the first and second directions,
wherein the first gate structure surrounds each of the plurality of nanosheets.

7. The semiconductor device of claim 1, wherein the field insulating layer is further disposed between the first gate structure and the spacer.

8. The semiconductor device of claim 1, wherein:
the interlayer insulating layer further includes a second part disposed on a first lateral side of the first part, a third part disposed on a second lateral side of the first part that is opposite to the first lateral side of the first part, a fourth part overlapping the second part of the interlayer insulating layer in a third direction perpendicular to the first and second directions, and a fifth part overlapping the third part of the interlayer insulating layer in the third direction, wherein the field insulating layer is disposed between the fourth part of the interlayer insulating layer and the fifth part of the interlayer insulating layer.

9. The semiconductor device of claim 8, wherein the spacer is further disposed between the fourth part of the interlayer insulating layer and the field insulating layer and between the fifth part of the interlayer insulating layer and the field insulating layer.

10. The semiconductor device of claim 8, wherein each of the fourth part of the interlayer insulating layer and the fifth part of the interlayer insulating layer is disposed to protrude in the first direction toward the field insulating layer.

11. The semiconductor device of claim 1, wherein the spacer further extends along a sidewall of the first gate structure in a third direction perpendicular to the first and second directions.

12. The semiconductor device of claim 1, further comprising:
an oxide layer disposed between the spacer and a sidewall of the first gate structure.

13. A semiconductor device comprising:
first and second active patterns each extending in a first direction and spaced apart from each other in a second direction that is perpendicular to the first direction;
a field insulating layer disposed between the first active pattern and the second active pattern;
a first gate structure disposed on the first active pattern and extending in the second. direction;
a second gate structure disposed on the second active pattern and extending in the second direction, the second gate structure is spaced apart from the first gate structure in the second direction;
a gate cut disposed on the field insulating layer and positioned between the first gate structure and the second gate structure;
an interlayer insulating layer disposed between the gate cut and the field insulating layer, the interlayer insulating layer including a first part disposed below the gate cut, a second part disposed on a first lateral side of the first part, and a third part disposed on a second lateral side of the first part that is opposite to the first lateral side of the first part; and
a spacer disposed between the gate cut and the first part of the interlayer insulating layer.

14. The semiconductor device of claim 13, wherein the spacer is further disposed between the :field insulating layer and the interlayer insulating layer.

15. The semiconductor device of claim 13, wherein the first part of the interlayer insulating layer is disposed between the second part of the interlayer insulating layer and the third part of the interlayer insulating layer and is configured to connect the second part of the interlayer insulating layer to the third part of the interlayer insulating layer.

16. The semiconductor device of claim 13, wherein the spacer is further in direct contact with a sidewall of the first active pattern.

17. The semiconductor device of claim 13, wherein the spacer is further in direct contact with a bottom surface of the first gate structure.

18. The semiconductor device of claim 13, wherein the spacer completely surrounds a sidewall and a bottom surface of the interlayer insulating layer.

19. A semiconductor device comprising:
first and second active patterns each extending in a first direction and spaced apart from each other in a second direction that is perpendicular to the first direction;
a field insulating layer disposed between the first active pattern and the second active pattern;
a plurality of nanosh.eets disposed on the first active pattern and sequentially stacked in a third direction that is perpendicular to the first and second directions;
a first gate structure disposed on the first active pattern and extending in the second direction, the first gate structure surrounds each of the plurality of nanosheets;
a second gate structure disposed on the first active pattern and extending in the second direction, the second gate structure is spaced apart from the first gate structure in the first direction;
a third gate structure disposed on the second active pattern and extending in the second direction, the third gate structure is spaced apart from the second gate structure in the second. direction;
a gate cut disposed on the field insulating layer and positioned between the second gate structure and the third gate structure;
an interlayer insulating layer disposed between the first gate structure and the field insulating layer and between the gate cut and the field insulating layer, the interlayer insulating layer including a first part disposed below the first gate structure, a second part disposed on a first lateral side of the first part, a third part disposed on a second lateral side of the first part that is opposite to the first lateral side of the first part, and a fourth part disposed below the gate cut;
a spacer disposed between the first gate structure and the interlayer insulating layer, between the gate cut and the interlayer insulating layer, and between the field insulating layer and the interlayer insulating layer; and
a source/drain region disposed on at least one side of the first gate structure,
wherein the first part of the interlayer insulating layer is disposed between the second part of the interlayer insulating layer and the third part of the interlayer insulating layer and is configured to connect the second part of the interlayer insulating layer to the third part of the interlayer insulating layer.

20. The semiconductor device of claim 19, wherein the spacer extends along a sidewall of the first gate structure in the third direction.

* * * * *